(12) United States Patent
Inada et al.

(10) Patent No.: US 8,617,930 B2
(45) Date of Patent: *Dec. 31, 2013

(54) ADHESIVE SHEET, DICING TAPE INTEGRATED TYPE ADHESIVE SHEET, AND METHOD OF PRODUCING SEMICONDUCTOR DEVICE

(71) Applicants: Teiichi Inada, Tsukuba (JP); Michio Mashino, Ichihara (JP); Michio Uruno, Ichihara (JP)

(72) Inventors: Teiichi Inada, Tsukuba (JP); Michio Mashino, Ichihara (JP); Michio Uruno, Ichihara (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/658,985

(22) Filed: Oct. 24, 2012

(65) Prior Publication Data

US 2013/0045585 A1 Feb. 21, 2013
US 2013/0224932 A9 Aug. 29, 2013

Related U.S. Application Data

(62) Division of application No. 12/047,200, filed on Mar. 12, 2008, now abandoned, which is a division of application No. 10/559,684, filed as application No. PCT/JP2004/008150 on Jun. 4, 2004, now abandoned.

(30) Foreign Application Priority Data

Jun. 6, 2003 (JP) ................. P2003-161656
Dec. 2, 2003 (JP) ................. P2003-402748

(51) Int. Cl.
*H01L 21/00* (2006.01)
*B32B 27/20* (2006.01)
*B32B 27/30* (2006.01)
*B32B 27/32* (2006.01)
*B32B 27/34* (2006.01)
*B32B 27/36* (2006.01)
*B32B 27/38* (2006.01)
*B32B 27/40* (2006.01)
*B32B 27/42* (2006.01)
*C08K 3/36* (2006.01)
*C08L 63/02* (2006.01)
*C08L 63/04* (2006.01)

(52) U.S. Cl.
USPC .............. 438/113; 257/E21.559; 428/413; 428/423.1; 428/424.8; 428/480; 428/483; 428/515; 428/516; 428/518; 428/520; 428/523; 523/445; 523/457; 523/466; 523/467; 525/117; 525/120; 525/134; 525/185; 525/390; 525/396; 525/420; 525/423; 525/429; 525/437; 525/438; 525/453; 525/454; 525/456; 525/461; 525/463; 525/481; 525/502; 525/523; 525/524

(58) Field of Classification Search
None
See application file for complete search history.

(56) References Cited

U.S. PATENT DOCUMENTS

| | | |
|---|---|---|
| 5,882,956 A | 3/1999 | Umehara et al. |
| 5,960,260 A | 9/1999 | Umehara et al. |
| 5,965,269 A | 10/1999 | Inada et al. |
| 6,012,818 A | 1/2000 | Araki |
| 6,090,468 A | 7/2000 | Shimada et al. |
| 6,114,753 A | 9/2000 | Nagai et al. |
| 6,265,782 B1 | 7/2001 | Yamamoto et al. |
| 6,342,434 B1 | 1/2002 | Miyamoto et al. |
| 6,521,337 B2 | 2/2003 | Yanagiuchi |
| 6,638,865 B2 | 10/2003 | Tanaka |
| 6,673,441 B1 | 1/2004 | Tanaka et al. |
| 6,716,674 B2 | 4/2004 | Yajima et al. |
| 6,992,026 B2 | 1/2006 | Fukuyo et al. |
| 7,070,670 B2 | 7/2006 | Tomiyama et al. |
| 7,749,867 B2 * | 7/2010 | Fukuyo et al. ............. 438/463 |
| 7,875,500 B2 * | 1/2011 | Inada et al. ................ 438/113 |
| 7,947,779 B2 * | 5/2011 | Inada et al. ................ 525/109 |
| 2002/0042189 A1 | 4/2002 | Tanaka |
| 2002/0050642 A1 | 5/2002 | Oota et al. |
| 2003/0069331 A1 | 4/2003 | Teiichi et al. |
| 2004/0002199 A1 * | 1/2004 | Fukuyo et al. ............. 438/460 |

| | | | |
|---|---|---|---|
| 2004/0068061 | A1 | 4/2004 | Kawate et al. |
| 2005/0227064 | A1 | 10/2005 | Jin |
| 2006/0100315 | A1 | 5/2006 | Inada et al. |
| 2006/0106166 | A1 | 5/2006 | Inada et al. |
| 2006/0128065 | A1 | 6/2006 | Inada et al. |
| 2007/0036971 | A1 | 2/2007 | Inada et al. |

FOREIGN PATENT DOCUMENTS

| | | | |
|---|---|---|---|
| CN | 1348208 | | 5/2002 |
| JP | 61-112345 | | 5/1986 |
| JP | 2-32181 | | 2/1990 |
| JP | 03-159153 | | 7/1991 |
| JP | 5-4485 | | 1/1993 |
| JP | 05-160258 | | 6/1993 |
| JP | 5-160258 A | * | 6/1993 |
| JP | 06-125002 | | 5/1994 |
| JP | 6-125002 A | * | 5/1994 |
| JP | 9-298369 | | 11/1997 |
| JP | 9-302313 | | 11/1997 |
| JP | 10-178067 | | 6/1998 |
| JP | 2000-248025 | | 9/2000 |
| JP | 2001-181586 | | 7/2001 |
| JP | 2001-279197 | | 10/2001 |
| JP | 2002-60716 | | 2/2002 |
| JP | 2002-158276 | | 5/2002 |
| JP | 2002-192370 | | 7/2002 |
| JP | 2002-192370 A | * | 7/2002 |
| JP | 2002-212536 | | 7/2002 |
| JP | 2002-222819 | | 8/2002 |
| JP | 2002-226796 | | 8/2002 |
| JP | 2002-226796 A | * | 8/2002 |
| JP | 2002-256235 | | 9/2002 |
| JP | 2002-280494 | | 9/2002 |
| JP | 2002-327165 | | 11/2002 |
| JP | 2003-096426 | | 4/2003 |
| JP | 2003-147299 | | 5/2003 |
| JP | 2003-147299 A | * | 5/2003 |
| JP | 2003-147323 | | 5/2003 |
| JP | 2003-338467 | | 11/2003 |
| JP | 2003-338467 A | * | 11/2003 |
| JP | 2004-95844 | | 3/2004 |
| JP | 2004-95844 A | * | 3/2004 |
| JP | 2005-19962 | | 1/2005 |
| KR | 2003-0029990 | | 4/2003 |
| TW | I318649 | | 12/2009 |
| WO | WO 98/15975 | | 4/1998 |
| WO | WO 01/60938 | | 8/2001 |
| WO | WO 01/74962 | | 10/2001 |
| WO | WO 02/22301 | | 3/2002 |
| WO | WO 02/086003 | | 10/2002 |

OTHER PUBLICATIONS

Chinese office action in Chinese application No. 200480015569X dated Jun. 8, 2007.*
Tiawanese office action for the corresponding Tiamwanese application dated Apr. 1, 2007.*
Chinese Official Action dated Jun. 8, 2007, for CN Application No. 200480015569X.
Taiwanese Official Action dated Apr. 1, 2008, for a counterpart Taiwanese patent application.
Japanese Official Action dated May 25, 2010, for JP Application No. 2005-506837.
Chinese Official Action dated Sep. 8, 2010, for CN Application No. 2008101869269.
Japanese Official Action dated Sep. 14, 2010, for JP Application No. 2004-124129.
Japanese Official Action dated Jun. 21, 2011, for JP Application No. 2005-506837.
H. Takaoka, "Fundamentals and features of stealth dicing techniques best for extremely thin semiconductor wafer", *Electronic Material*, vol. 41, No. 9, pp. 17-21, 2005.
Chinese Official Action dated Jul. 27, 2011, for CN Application No. 2008101658215.
Chinese Official Action dated Nov. 1, 2011, for CN Application No. 200810165822X.
Korean Official Action dated Feb. 13, 2012, for KR Application No. 10-2011-7029423.
Taiwanese Official Action dated May 23, 2012, for TW Application No. 97136358.
Taiwanese Official Action dated May 23, 2012, for TW Application No. 97136360.
Communication mailed Mar. 5, 2013, in connection with Japanese Patent Application No. 2010-167363, 2 pages; Japanese Patent Office, Japan.

* cited by examiner

*Primary Examiner* — Robert Sellers
(74) *Attorney, Agent, or Firm* — Antonelli, Terry, Stout & Kraus, LLP.

(57) ABSTRACT

The invention provides an adhesive sheet which can be stuck to a wafer at low temperatures of 100° C. or below, which is soft to the extent that it can be handled at room temperature, and which can be cut simultaneously with a wafer under usual cutting conditions; a dicing tape integrated type adhesive sheet formed by lamination of the adhesive sheet and a dicing tape; and a method of producing a semiconductor device using them. In order to achieve this object, the invention is characterized by specifying the breaking strength, breaking elongation, and elastic modulus of the adhesive sheet in particular numerical ranges.

13 Claims, 9 Drawing Sheets

ADHESIVE SHEET, DICING TAPE INTEGRATED TYPE ADHESIVE SHEET, AND METHOD OF PRODUCING SEMICONDUCTOR DEVICE

This application is a Divisional application of application Ser. No. 12/047,200, filed Mar. 12, 2008, now abandoned, which is a Divisional application of application Ser. No. 10/559,684, filed Dec. 6, 2005, now abandoned, the contents of each of which are incorporated herein by reference in their entirety. No. 10/559,684 is a National Stage Application filed under 35 USC 371 of International (PCT) Application No. PCT/JP04/08150, filed Jun. 4, 2004.

This application claims priority of Japanese Application No. JP 2003-161656, filed Jun. 6, 2003; and Japanese Application No. 2003-402748, filed Dec. 2, 2003, the contents of each of which are incorporated herein by reference in their entirety.

TECHNICAL FIELD

The present invention relates to an adhesive sheet suitable for the joint of a semiconductor element with a semiconductor-element-mounting support member, a dicing tape integrated type adhesive sheet, and a method of producing a semiconductor device using them.

BACKGROUND ART

Hitherto, silver paste has been mainly used to joint a semiconductor element with a semiconductor-element-mounting support member. However, the support member used has also been required to be made small-sized and minute as semiconductors have been made small-sized and the performance thereof has been made high in recent years. Silver paste has come not to meet such requirements by generating of the problem at the time of wire bonding resulting from the paste smudge and the inclination of semiconductor elements, control difficulty of the film thickness of an adhesive sheet, generating of voids in the adhesive sheet, and others. In recent years, therefore, a sheet-form adhesive has come to be used in order to meet the requirements.

This adhesive sheet is used in an individual-piece sticking mode or a wafer-back-face sticking mode. When the adhesive sheet in the former individual-piece sticking mode is used to produce a semiconductor, the semiconductor device is obtained by cutting or punching out a reel-form adhesive sheet into individual pieces, bonding one out of the individual pieces onto a support member, jointing a semiconductor element made, through a dicing step, into an individual piece onto the adhesive-sheet-bonded support member to form a semiconductor-element-jointed support member, and, if necessary, causing this member to undergo a wire bonding step, a sealing step and other steps. However, in order to use the adhesive sheet in the individual-piece sticking mode, it is necessary to use an exclusive fabricating device for cutting the adhesive sheet and then bonding the resultant onto the support member. Accordingly, there arises a problem that costs for the production are higher than those in the method using silver paste.

Meanwhile, when the adhesive sheet in the wafer-back-face sticking mode is used to produce a semiconductor device, the semiconductor device is obtained by sticking the adhesive sheet onto the back face of a semiconductor wafer, sticking a dicing tape onto the other face of the adhesive sheet, dicing the wafer into individual semiconductor elements, picking up one of the individual adhesive-sheet-bonded semiconductor elements, jointing it with a support member, and causing the resultant to undergo the steps of heating, curing, wire bonding and others. This adhesive sheet in the wafer-back-face sticking mode does not require any device for making an adhesive sheet into individual pieces since a semiconductor element with the adhesive sheet is jointed with a support member. Thus, a conventional fabricating device for silver paste can be used as it is, or the device can be used in the state that a part thereof is improved by, for example, the addition of a hot plate thereto. For this reason, attention is paid to the production method, as a method capable of making costs for the production relatively inexpensive, among fabricating methods using an adhesive sheet.

However, in the method using an adhesive sheet in the wafer-back-face sticking mode, it is necessary to conduct two sticking steps, wherein the adhesive sheet and a dicing tape are stuck, before the above-mentioned dicing step. For this reason, there has been a require for simplified working steps. Thus, suggested is a method of putting an adhesive sheet onto a dicing tape, and sticking the resultant on a wafer (for example, Japanese Patent Application Laid-Open Nos. 2002-226796, 2002-158276, and 2-32181).

In the method using an adhesive sheet in the wafer-back-face sticking mode, it is necessary to cut the adhesive sheet at the same time as a wafer is diced. However, in ordinary dicing methods using a diamond blade, it is necessary to make the cutting speed small in order to cut the wafer and the adhesive sheet simultaneously. Thus, costs increase.

In recent years, the following is suggested as a wafer-cutting method: a method of performing the step of making a wafer into a state that the wafer can easily be cut, such as the step of making trenches which will be cutting stripes in a wafer without being completely cut or the step of forming a modified regions by radiating a laser into a wafer along lines intended to be cut; and subsequently cutting the wafer by, for example, the application of external force thereto. The former is called half cut dicing, and the latter is called stealth dicing (for example, Japanese Patent Application Laid-Open Nos. 2002-192370 and 2003-338467). These methods have an advantageous effect of decreasing defects, such as chipping, when the thickness of a wafer is particularly small. Moreover, the methods require no calf width. Thus, according to the methods, yield-improving effect and other effects can be expected.

In order to perform a semiconductor device producing process according to the wafer-back-face sticking mode by use of the half cut dicing or stealth dicing, it is necessary to cut an adhesive sheet and a wafer simultaneously. However, when an ordinal adhesive sheet is used, it is difficult to cut the sheet at the same time as a wafer is cut. When a non-elastic adhesive sheet having a good breakability is used as the adhesive sheet, the adhesive sheet and a wafer can be simultaneously cut in the state that cutting faces of the two are made substantially consistent. However, the non-elastic adhesive sheet has a low fluidity; therefore, the sheet is not easily stuck onto the wafer at a low temperature of 100° C. or lower. Additionally, the adhesive sheet is cracked since the adhesive sheet itself is brittle. Thus, it is feared that adhesion reliability thereof deteriorates.

DISCLOSURE OF THE INVENTION

As described above, in the method using an adhesive sheet in the wafer-back-face sticking mode, no way of permitting a wafer and the adhesive sheet to be effectively cut has been found. Accordingly, in a dicing step in the production of a semiconductor device, an adhesive sheet has been desired which can be cut at the same time as a wafer is cut after the work of the wafer into a cut-permissible state. Moreover, in the step of jointing a semiconductor element with a support member in the production of a semiconductor device, an adhesive sheet which is excellent in adhesion reliability has been desired.

An object of the present invention is to provide an adhesive sheet which can be stuck onto a wafer at low temperatures, is so flexible that the sheet can be handled at room temperature, and can be cut at the same time as the wafer is cut under ordinary cutting conditions.

The inventors have found out that when the breaking strength and the breaking elongation of an adhesive sheet in a B-stage state at 25° C. are restricted into specific numerical ranges, it is possible to obtain an adhesive sheet which can be cut at the same time as a wafer is cut at room temperature.

Furthermore, the inventors have found out that in order for an adhesive sheet to keep flexibility at room temperature and be cut at the same time as a wafer is cut at room temperature, it is necessary that the elastic modulus of the adhesive sheet has a specific frequency dependency. The frequency dependency is a phenomenon that a sample has an elastic modulus variable in accordance with the frequency of a strain applied to the sample in the measurement of the dynamic viscoelasticity.

Specifically, the present invention has, as it features, matters described in the following <1> to <15>:

<1> An adhesive sheet, comprising a polymer component, the breaking strength of the adhesive sheet in a B-stage state being from 0.1 to 10 MPa at 25° C., and the breaking elongation thereof being from 1 to 40% at 25° C.

<2> An adhesive sheet, comprising a polymer component, the elastic modulus of the adhesive sheet in a B-stage state being from 1 to 3000 MPa in measurement of the dynamic viscoelasticity at 25° C. and 10 Hz, and the elastic modulus thereof being from 4000 to 20000 MPa in measurement of the dynamic viscoelasticity at 25° C. and 900 Hz.

<3> An adhesive sheet, comprising a polymer component, the elastic modulus of the adhesive sheet in a B-stage state being from 1 to 3000 MPa in measurement of the dynamic viscoelasticity at 25° C. and 10 Hz, and the elastic modulus thereof being from 4000 to 20000 MPa in measurement of the dynamic viscoelasticity at −20° C. and 10 Hz.

<4> The adhesive sheet according to the above-mentioned <2> or <3>, comprising the polymer component, and the elastic modulus of the adhesive sheet in a B-stage state being from 0.1 to 20 MPa in measurement of the dynamic viscoelasticity at 60° C. and 10 Hz.

<5> The adhesive sheet according to any one of the above-mentioned <2> to <4>, comprising the polymer component, the breaking strength of the adhesive sheet in a B-stage state being from 0.1 to 10 MPa at 25° C., and the breaking elongation thereof being from 1 to 40% at 25° C.

<6> The adhesive sheet according to any one of the above-mentioned <1> to <5>, wherein the polymer component has a glass transition temperature of −30 to 50° C., and a weight-average molecular weight of 50000 to 1000000.

<7> The adhesive sheet according to the above-mentioned <6>, wherein the polymer component, which has a glass transition temperature of −30 to 50° C. and a weight-average molecular weight of 50000 to 1000000, is contained in an amount of 50% or less of the total weight of the adhesive sheet from which the weight of a filler is removed.

<8> The adhesive sheet according to the above-mentioned <7>, further comprising a thermosetting component.

<9> The adhesive sheet according to the above-mentioned <7> or <8>, further comprising 5 to 70% by weight of the filler.

<10> The adhesive sheet according to any one of the above-mentioned <1> to <9>, wherein the content of remaining volatile matters is from 0.01 to 3% by weight.

<11> The adhesive sheet according to any one of the above-mentioned <1> to <10>, which has a film thickness of 1 to 250 μm.

<12> A dicing tape integrated type adhesive sheet formed by lamination of the adhesive sheet according to any one of the above-mentioned <1> to <11> and a dicing tape.

<13> A method of producing a semiconductor device, comprising: I) the step of sticking the adhesive sheet according to any one of the above-mentioned <1> to <11> onto a semiconductor wafer, II) the step of rendering the semiconductor wafer permissible to be cut, III) the step of sticking a dicing tape onto the adhesive sheet in order of I-II-III, II-I-III, or I-III-II, and further comprising: IV) the step of cutting the semiconductor wafer and the adhesive sheet, thereby yielding adhesive-sheet-stuck semiconductor chips which are individual pieces, and V) the step of bonding the adhesive-sheet-stuck semiconductor chips onto a semiconductor-chip-mounting support member.

<14> A method of producing a semiconductor device, comprising: I') the step of sticking the dicing tape integrated type adhesive sheet according to the above-mentioned <12> onto a semiconductor wafer, and II) the step of rendering the semiconductor wafer permissible to be cut in order of I'-II or II-I', and further comprising: IV) the step of cutting the semiconductor wafer and the adhesive sheet of the dicing tape integrated type adhesive sheet, thereby yielding adhesive-sheet-stuck semiconductor chips which are individual pieces, and V) the step of bonding the adhesive-sheet-stuck semiconductor chips onto a semiconductor-chip-mounting support member.

<15> The method of producing a semiconductor device according to the above-mentioned <13> or <14>, wherein a method for rendering the semiconductor wafer permissible to be cut is half cut dicing or stealth dicing.

The present application is an application with priority claims based on some Japanese Patent Applications filed previously by the Applicant, that is, Japanese Patent Application No. 2003-161656 (filed on Jun. 6, 2003) and Japanese Patent Application No. 2003-402748 (filed on Dec. 2, 2003), Whose specifications are incorporated herein by reference.

BEST MODE FOR CARRYING OUT THE INVENTION

Figure 1:
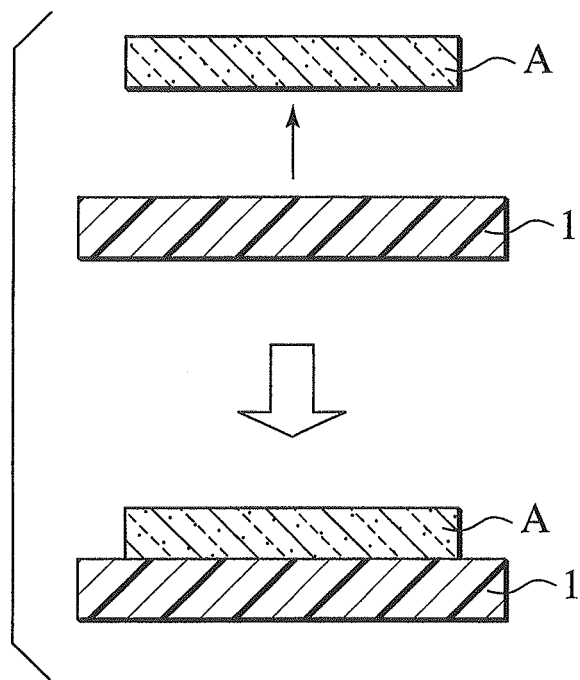
FIG. 1 is a schematic view illustrating an embodiment of the step I) in the invention.

The adhesive sheet of the present invention comprises a polymer component, and has the breaking strength in a B-stage state from 0.1 to 10 MPa at 25° C., and the breaking elongation from 1 to 40% at 25° C.

If the breaking strength is less than 0.1 MPa, the adhesive sheet is brittle and the handleability thereof deteriorates. If the breaking strength is more than 10 MPa, the adhesive sheet cannot be cut at the same time as a wafer is cut, which being inappropriate. Similarly, if the breaking elongation is less than 1%, the adhesive sheet is brittle and the handleability thereof deteriorates. If the breaking elongation is more than 40%, the adhesive sheet cannot be cut at the same time as a wafer is cut, which being inappropriate. The breaking strength and the breaking elongation are preferably from 1 to 8 MPa and from 5 to 35%, respectively, and are more preferably from 3 to 7 MPa and from 10 to 30%, respectively, since the adhesive sheet can be surely broken when the wafer is broken and further the adhesive sheet has a sufficient strength and an excellent handleability.

The breaking strength and the breaking elongation of the B-stage state adhesive sheet at 25° C. are values obtained by using a tensile tester to measure the stress-strain curve of a sample having a width of 10 mm, a distance between chucks of 20 mm and a thickness of 5 to 250 μm at a tensile speed of 0.5 m/minute and then making calculations in accordance with the following equations:

Breaking strength(Pa)=Maximum strength(N)/Sectional area($m^2$)of the sample

Breaking elongation(%)=(Sample length(mm)when the sample is broken−20)/20×100

In order to raise the breaking strength, it is effective to make the elastic modulus high and further make the toughness of the material large. Specifically, it is effective to make the elastic modulus high by the addition of various filler additives, and add a small amount of rubber or the like in order to improve the toughness of the material. In order to decrease the breaking strength, it is effective to increase the adding amount of an oligomer and a monomer to decrease the breaking elongation of the film.

In order to raise the breaking elongation, it is effective to improve the flexibility and the toughness of the material. For example, it is effective to increase the amount of a polymer component having a low Tg and a large molecular weight and the adding amount of an oligomer and a monomer which each have a softening temperature lower than 30° C. In order to decrease the breaking elongation, it is effective to increase the adding amount of an oligomer and a monomer which each have a softening temperature of 30° C. or higher and the amount of a polymer component having a high Tg, and add a filler to lower the toughness.

The adhesive sheet of the present invention comprises a polymer component, and has the elastic modulus in a B-stage state from 1 to 3000 MPa in measurement of the dynamic viscoelasticity at 25° C. and 10 Hz, and the elastic modulus from 4000 to 20000 MPa in measurement of the dynamic viscoelasticity at 25° C. and 900 Hz.

The elastic modulus at 25° C. and 10 Hz is preferably from 10 to 1500 MPa, more preferably from 100 to 1200 MPa since the adhesive sheet is not easily cracked when it is handled. If the elastic modulus is less than 1 MPa, the elongation of the adhesive sheet is large so that it is not easily handled. If the elastic modulus is more than 3000 MPa, the adhesive sheet is cracked when it is handled, which are not preferable. The elastic modulus at 25° C. and 900 Hz is preferably from 5000 to 15000 MPa. If the elastic modulus is less than 4000 MPa, the adhesive sheet tends not to be easily cut. If the elastic modulus is more than 20000 MPa, the adhesive sheet tends to be easily cracked when it is handled.

The adhesive sheet of the present invention comprises a polymer component, and has the elastic modulus in a B-stage state from 1 to 3000 MPa in measurement of the dynamic viscoelasticity at 25° C. and 10 Hz, and the elastic modulus from 4000 to 20000 MPa in measurement of the dynamic viscoelasticity at −20° C. and 10 Hz.

The elastic modulus at −20° C. and 10 Hz is preferably from 5000 to 15000 MPa. If the elastic modulus is less than 4000, the adhesive sheet tends not to be easily cut. If it is more than 20000 MPa, the adhesive sheet tends to be easily cracked when it is handled.

It is sufficient that in any adhesive sheet of the invention, the various physical properties are within the above-specified ranges when the adhesive sheet is cut after the sheet is stuck onto a wafer. Thus, when the adhesive sheet is stuck, the physical properties may not be within the ranges. In other words, it is sufficient that the various physical properties are within the above-mentioned ranges after a given storage period from the time when the adhesive sheet is stuck onto a wafer or after the adhesive sheet undergoes working of thermal treatment or radial ray radiation such as optical curing. For example, in the case of using an adhesive sheet having a large breaking strength and a large breaking elongation before the sheet is stuck onto a semiconductor wafer, the adhesive sheet can be stuck onto the semiconductor wafer at a low temperature. The breakability can be improved by setting the breaking strength and the breaking elongation within the above-mentioned ranges after the adhesive sheet is stuck. Similarly, even if the elastic modulus of an adhesive sheet at 25° C. and 10 Hz is less than 1 MPa at an initial stage, the adhesive sheet has intense adhesive property and can easily be laminated at room temperature when the adhesive sheet is stuck onto a wafer. Thereafter, the elastic modulus is set into the above-mentioned range, whereby the breakability can be improved.

When the adhesive sheet of the present invention is used, it is preferred to laminate the sheet onto a wafer at a temperature from 40 to 100° C. in order to make a warp of the wafer small and make the handleability good at room temperature. For this purpose, as for the adhesive sheet of the present invention, the elastic modulus of the adhesive sheet in a B-stage state is preferably from 0.1 to 20 MPa, more preferably from 0.1 to 10 MPa, and in particular preferably from 0.1 to 5 MPa in measurement of the dynamic viscoelasticity at 60° C. and 10 Hz. If the elastic modulus is less than 0.1 MPa, the sheet may be peeled or shifted from a wafer after the sheet is stuck thereto, which is not preferred.

The adhesive sheet of the present invention preferably has the above-mentioned various properties as well as heat resistance and humidity resistance required when a semiconductor element is mounted onto a semiconductor-element-mounting support member. Especial limitation is not imposed on the adhesive sheet of the present invention if the adhesive sheet satisfies the above-mentioned properties. It is preferred that the adhesive sheet contains a thermosetting component and a filler besides the polymer component since the adhesive sheet has an appropriate tacking strength and a good handleability in a sheet form. The adhesive sheet may contain, additionally, a curing accelerator, a catalyst, an additive, a coupling agent, and so on. The breaking strength and the breaking elongation tend to become higher as the amount of the polymer component contained in the adhesive sheet is larger and the amount of the filler is smaller; it is therefore important to adjust these components such that the breaking strength and the breaking elongation are set within the numerical ranges specified in the present invention.

The following will describe the components which constitute any adhesive sheet of the present invention in more detail.

The polymer component in the present invention is not particularly limited as long as the component causes the properties of the adhesive sheet to be satisfied. Preferably, the glass transition temperature (abbreviated to Tg hereinafter) thereof is from −30 to 50° C. and the weight-average molecular weight is from 50000 to 1000000. If the Tg is higher than 50° C., the flexibility of the sheet is inconveniently low. If the Tg is lower than −30° C., the flexibility of the sheet is too high. Thus, it is not convenient since the sheet is not easily broken when the wafer thereon is broken. If the weight-average molecular weight is less than 50000, the heat resistance of the sheet lowers inconveniently. If the molecular weight is more than 1000000, the fluidity of the sheet lowers inconveniently.

From the viewpoint of the breakability and the heat resistance of the adhesive sheet when the wafer thereon is cut, the Tg and the weight-average molecular weight are more preferably from −20 to 40° C. and from 100000 to 900000, respectively, preferably from −10 to 50° C. and from 50000 to 1000000, respectively, and in particular preferably from −10 to 30° C. and from 500000 to 900000, respectively. The weight-average molecular weight is a value in terms of polystyrene on the basis of gel permeation chromatography (GPC) using a calibration curve of standard polystyrene, and was measured by using an L-6000 (trade name) manufactured by Hitachi Ltd. as a pump, a column wherein a Gelpack GL-R440, a Gelpack GL-R450 and a Gelpack GL-R400M (each 10.7 mm diameter×300 mm) manufactured by Hitachi Chemical Co., Ltd. are connected in this order as a column, and tetrahydrofuran as an eluent, and measuring a sample wherein 120 mg of a specimen was dissolved in 5 mL of THF at a flow rate of 1.75 mL/minute.

Specific examples of the polymer component include polyimide, polystyrene, polyethylene, polyester, polyamide, butadiene rubber, acrylic rubber, (meth) acrylic resin, urethane resin, polyphenylene ether resin, polyetherimide resin, phenoxy resin, modified polyphenylene ether resin, phenoxy resin, polycarbonate, and mixtures thereof. Particularly preferred is a polymer component containing a functional monomer and having a weight-average molecular weight of 100000 or more, for example, an epoxy group-containing (meth)acrylic copolymer containing a functional monomer, such as glycidyl acrylate or glycidyl methacrylate, and further having a weight-average molecular weight of 100000. As the epoxy group—containing (meth)acrylic copolymer, for example, (meth)acrylic ester copolymer, acrylic rubber or the like can be used. Acrylic rubber is more preferred. Acrylic rubber is a rubber which contains an acrylic acid ester as a main component and is made mainly of a copolymer made of butyl acrylate, acrylonitrile and others, or a copolymer made of ethyl acrylate, acrylonitrile and others.

The polymer component is contained preferably in an amount of 50% or less of the total weight of the adhesive sheet from which the weight of the filler is removed, more preferably in an amount of 35% or less, and in particular preferably in an amount from 25 to 35%. If the blend amount of the polymer component is large, the breakability of the adhesive sheet tends to deteriorate. If the blend amount is small, the fluidity is too large when the sheet is bonded so that voids tend to be generated.

Examples of the thermosetting component include epoxy resin, cyanate resin, phenol resin, and cured products thereof. Epoxy resin is preferred since the resin has a high heat resistance. The epoxy resin is not particularly limited as long as the resin has adhesive effect when it is cured. The following can be used: a bifunctional epoxy resin such as bisphenol A type epoxy; a novolak epoxy resin such as phenol novolak epoxy resin or cresol novolak epoxy resin; or the like. Moreover, an ordinarily-known epoxy resin can be used, examples of which include polyfunctional epoxy resin, glycidylamine epoxy resin, heteroring-containing epoxy resin, or alicyclic epoxy resin.

It is preferred to incorporate a filler, preferably an inorganic filler into the adhesive sheet of the invention in order to decrease the breaking strength and the breaking elongation of the adhesive sheet in a B-stage state, improve the handleability and thermal conductivity of the adhesive, adjust the melting viscosity, and give thixotropy.

Examples of the inorganic filler include aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, amorphous silica, and antimony oxide. In order to improve the thermal conductivity, preferred are alumina, aluminum nitride, boron nitride, crystalline silica, amorphous silica, and so on. In order to adjust the melting viscosity and give thixotropy, preferred are aluminum hydroxide, magnesium hydroxide, calcium carbonate, magnesium carbonate, calcium silicate, magnesium silicate, calcium oxide, magnesium oxide, alumina, crystalline silica, amorphous silica, and so on. In order to improve the humidity resistance, preferred are alumina, silica, aluminum hydroxide, and antimony oxide.

The amount of the filler is preferably from 5 to 70% by weight of the total of the adhesive sheet, more preferably from 35 to 60% by weight. If the blend amount thereof is large, there are easily caused problems, such as a rise in the storage elastic modulus of the adhesive sheet, a fall in the adhesive property thereof, and a deterioration in the electrical properties due to remaining voids. Thus, the amount is in particular preferably set to 50% or less by weight. The specific gravity of the filler is preferably from 1 to 10 g/cm$^3$.

The adhesive sheet of the invention may contain an acrylic monomer having in the molecule thereof one or more unsaturated double bonds and a photoinitiator therefor, thereby having UV curability. When the adhesive sheet is laminated at a low temperature and then the breaking elongation thereof is lowered by the irradiation with UV, the breakability can be improved.

The adhesive sheet of the invention can be obtained by mixing and kneading the above-mentioned polymer component and the optional thermosetting component, filler and other components in an organic solvent to prepare a varnish, forming a layer of the varnish on a substrate film, heating and drying the layer, and then removing the substrate.

The above-mentioned mixing and kneading can be performed by means of an appropriate combination of two or more ordinary dispersers such as a stirrer, a crusher, a three-axis roll, and a ball mill. Conditions for the above-mentioned heating and drying are not particularly limited as long as the conditions are conditions for volatilizing the used solvent sufficiently. Usually, the vanish layer is heated at 60 to 200° C. for 0.1 to 90 minutes.

The organic solvent used in the preparation of the varnish in the production of the adhesive sheet is not particularly limited as long as the solvent is an organic solvent which makes it possible to dissolve, knead and disperse the materials evenly, and the solvent may be one which is known in the art. Examples of such a solvent include dimethylformamide, dimethylacetoamide, N-methylpyrrolidone, ketone solvents such as acetone, methyl ethyl ketone and cyclohexanone, toluene, and xylene. Methyl ethyl ketone, cyclohexanone or the like is preferably used since it has a high drying rate and it is inexpensive.

The amount of the used organic solvent is not particularly limited as long as the remaining volatile matter content is from 0.01 to 3% by weight of the whole after the adhesive sheet is produced. From the viewpoint of heat-resistant reliability, the content is preferably from 0.01 to 2.0% by weight, more preferably from 0.01 to 1.5% by weight of the whole.

Plural bodies of any adhesive sheet of the invention may be stacked onto each other to produce a multi-layered adhesive sheet as long as they can be cut. A multi-layered adhesive sheet may be produced by combining any adhesive sheet of the present invention with a film made of a thermoplastic film, an adhesive, a thermosetting resin and so on and laminating two bodies of the adhesive sheet on both faces of the film. The wording "as long as they can be cut" means that the breaking strength and the breaking elongation of the multi-layered sheet are within the above-mentioned numerical ranges. Such a film is, for example, a film made of a thermoplastic resin such as polyimide or polyester, an epoxy resin, a silicon resin, or a mixture thereof. The film may contain various fillers.

The film thickness of any adhesive sheet of the invention is not particularly limited, and is preferably from 1 to 250 μm. If the thickness is smaller than 1 μm, the stress-relaxing effect and the adhesive property thereof tend to become poor. If the thickness is larger than 250 μm, economical disadvantages are generated. Furthermore, a requirement of making a semiconductor device small-sized is not met and the adhesive sheet tends not to be easily broken. The thickness is preferably from 3 to 100 μm, more preferably from 5 to 55 μm since a high adhesive property is given and a semiconductor device can be made small-sized.

The dicing tape integrated type adhesive sheet of the present invention can be obtained by laminating any adhesive sheet of the present invention on a known dicing tape. When this dicing tape integrated type adhesive sheet is used, only a single step of lamination onto a wafer is required and the work can be made effective. The method for laminating the adhesive sheet onto the dicing tape may be, for example, a method of pressing or hot-roll-laminating the adhesive sheet formed in advance onto the dicing tape besides printing. Preferred is the hot-roll-laminating method since the dicing tape integrated type adhesive sheet can be continuously produced and the efficiency of the method is good.

Examples of the dicing tape used in the invention include a polytetrafluoroethylene film, a polyethylene terephthalate film, a polyethylene film, a polypropylene film, a polymethylpentene film, a polyimide film, and other plastic films. If necessary, the dicing tape may be subjected to a surface treatment such as primer painting, UV treatment, corona discharge treatment, polishing treatment, or etching treatment. The dicing tape needs to have adhesiveness. An adhesive layer may be formed on a single face of the dicing tape. This can be formed by painting and drying a resin composition, for the adhesive layer, having an appropriate tacking strength obtained by adjusting, in particular, the ratio between liquid components therein, or the Tg of the polymer component therein.

The film thickness of the dicing tape is not particularly limited, and is appropriately decided on the basis of knowledge of those skilled in the art in accordance with the film thickness of the adhesive sheet or the usage of the dicing tape integrated type adhesive sheet. The film thickness is from 60 to 150 μm, preferably from 70 to 130 μm since economical advantages are given and the handleability of the film is good.

It is necessary that any adhesive sheet of the present invention or the adhesive sheet of the dicing tape integrated type adhesive sheet of the invention has such an adhesive force that semiconductor elements are not scattered at the time of dicing in the production of a semiconductor device and can be peeled from the dicing tape at the time of picking-up subsequent thereto. For example, if the adhesiveness of the adhesive sheet or the dicing tape is too high, the resin in terminal regions of the trenches melts so that the separation thereof becomes difficult. Therefore, the 90° peel strength between the adhesive sheet of the invention and a dicing tape thereon in a B-stage state is preferably 150 N/m or less, more preferably from 5 to 100 N/m, and even more preferably from 5 to 50 N/m. If the peel strength is more than 150 N/m, chips tend to be easily cracked at the time of the picking-up. The peel strength is a result obtained when the adhesive sheet is peeled from the dicing tape at an angle of 90° and a tensile speed of 50 mm/minute in an atmosphere of 25° C. temperature.

In order to set the 90° peel strength to 150 N/m or less, it is desired to adjust the tacking strength of the adhesive sheet appropriately. It is advisable to perform the method for adjusting the tacking strength by use of a nature that: when the fluidity of the adhesive sheet is raised at room temperature, the adhesive force and the tacking strength tend to rise; and when the fluidity is lowered, the adhesive force and the tacking strength tend to fall. For example, to raise the fluidity, methods such as an increase in the content of a plasticizer, an increase in the content of a tackifier, or some other methods are adopted. Conversely, to lower the fluidity, the content of above-mentioned compound is decreased. Examples of the plasticizer include a monofunctional acrylic monomer, a monofunctional epoxy resin, a liquid epoxy resin, an acrylic resin, and what is called a diluting agent of an epoxy type.

A semiconductor device can be produced by use of any adhesive sheet of the present invention or a dicing tape integrated type adhesive sheet having any adhesive sheet of the invention.

Specifically, a method of producing the semiconductor of the invention comprises: I) the step of sticking any adhesive sheet of the invention onto a semiconductor wafer, II) the step of rendering the semiconductor wafer permissible to be cut, III) the step of sticking a dicing tape onto the adhesive sheet of the invention in order of I-II-III, II-I-III, or I-III-II, and further comprises: IV) the step of cutting the semiconductor wafer and the adhesive sheet, thereby yielding adhesive-sheet-stuck semiconductor chips which are individual pieces, and V) the step of bonding the adhesive-sheet-stuck semiconductor chips onto a semiconductor-chip-mounting support member.

Figure 2:
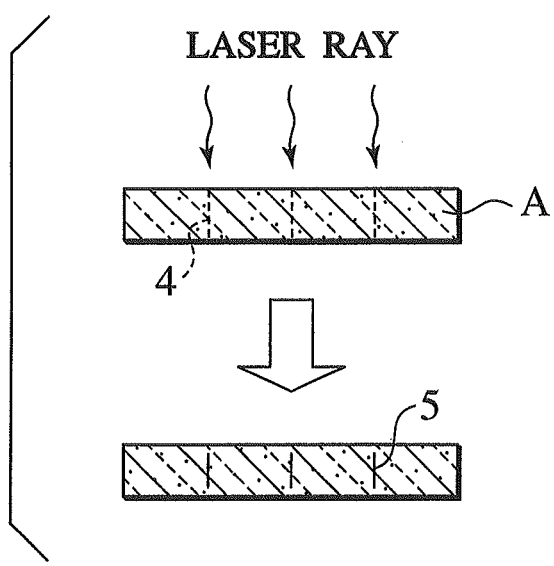
FIG. 2 is a schematic view illustrating an embodiment of the step II) in the invention.
Figure 3:
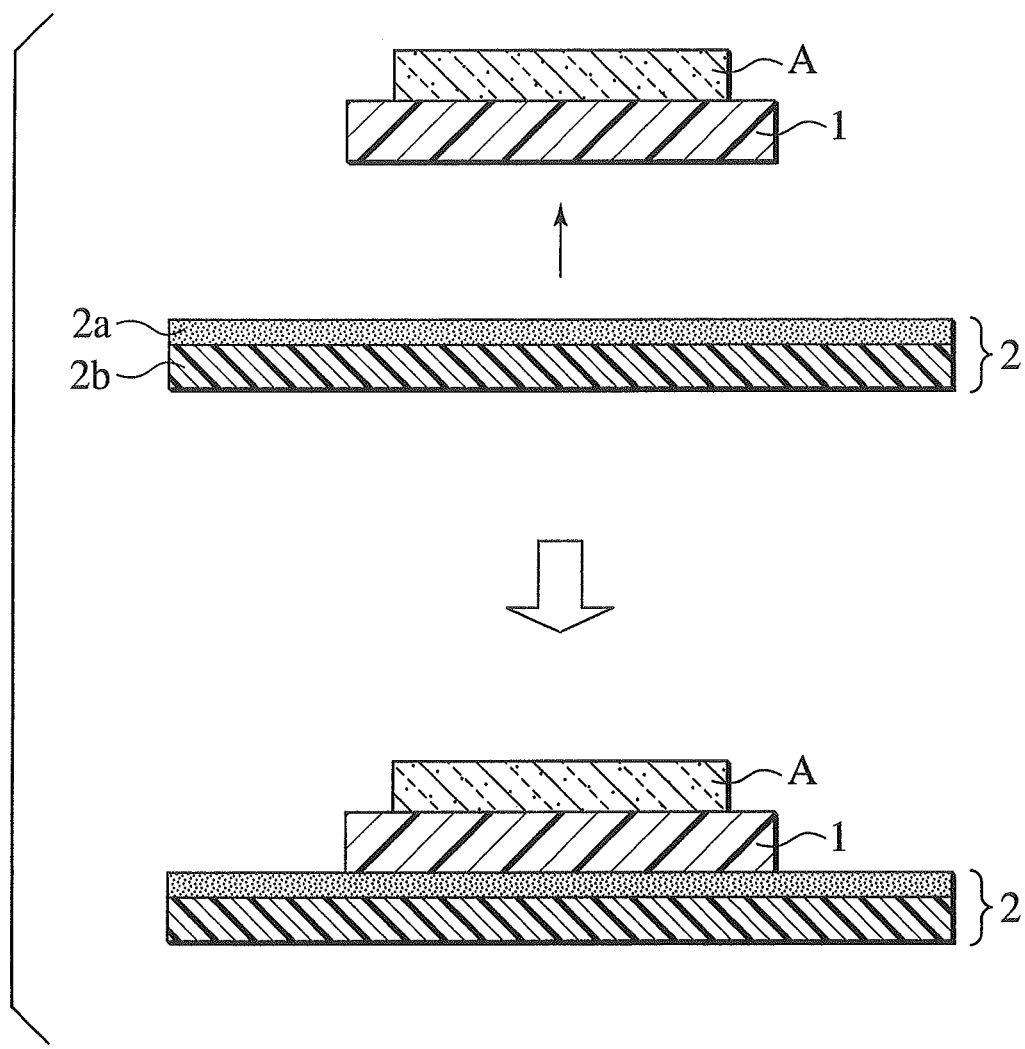
FIG. 3 is a schematic view illustrating an embodiment of the step III) in the invention.
Figure 4:
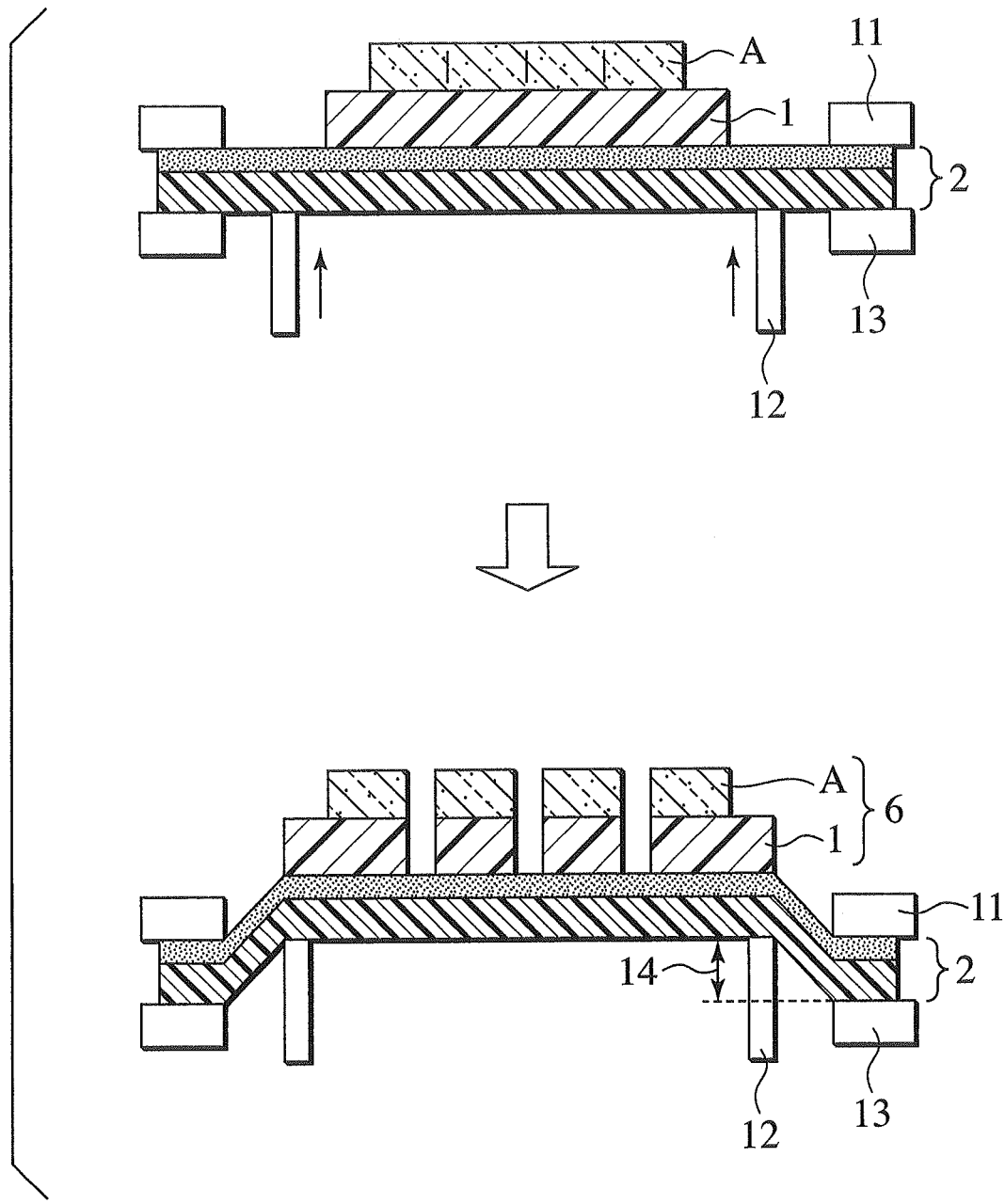
FIG. 4 is a schematic view illustrating an embodiment of the step IV) in the invention.
Figure 5:
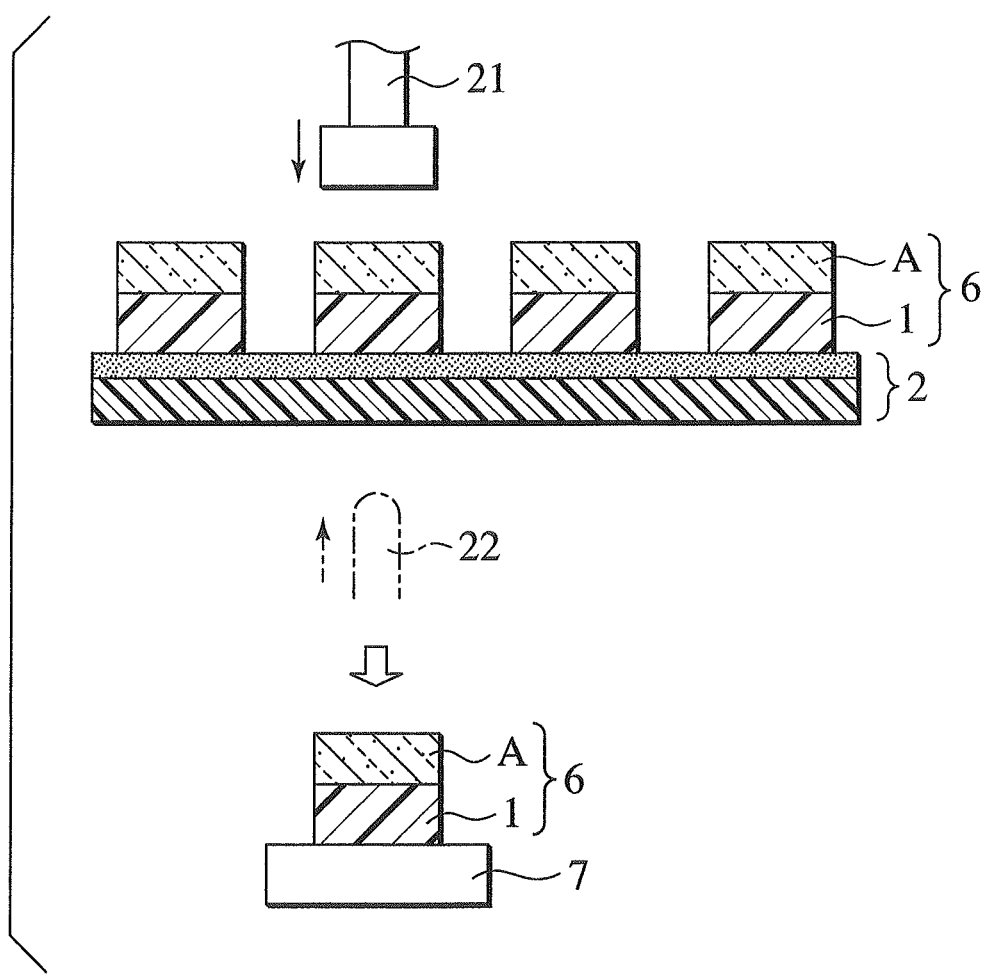
FIG. 5 is a schematic view illustrating an embodiment of the step V) in the invention.

FIG. 1 illustrates an embodiment of the step of sticking an adhesive sheet 1 of the present invention onto a semiconductor wafer A; FIG. 2 illustrates that of the step of radiating a laser ray onto lines along which the semiconductor wafer A is to be cut, thereby forming modified regions (cutting-intended regions) 5 inside the wafer to render the wafer permissible to be cut; FIG. 3 illustrates that of the step of sticking a dicing tape 2 composed of an adhesive layer 2a and a substrate layer 2b onto the adhesive sheet 1; FIG. 4 illustrates that of the step of expanding the dicing tape 2, thereby cutting the semiconductor wafer A and the adhesive sheet 1; and FIG. 5 illustrates that of the step of bonding an adhesive-sheet-stuck semiconductor chip 6 onto a semiconductor-chip-mounting support member 7.

The semiconductor wafer is made of one or more selected from polycrystal silicon, various ceramics, and compound semiconductors, such as gallium arsenic, besides monocrystal silicon.

The temperature at which the adhesive sheet is stuck onto the wafer in the step I), that is, the laminating temperature is preferably from 0 to 170° C. In order to make a warp of the wafer small, the temperature is more preferably from 20 to 130° C., in particular preferably from 20 to 60° C. When the step I) is performed after the step II), it is preferred to perform the lamination while the wafer is supported not to be deformed in order to prevent the wafer from being broken by stress or deformation in the laminating step.

The working method for rendering the wafer permissible to be cut in the step II) may be a method of rendering the wafer which will be able to be easily cut by subsequent application of external force thereto. For example, a method of making trenches which will be cutting stripes without cutting the wafer completely into chips with a dicing cutter or the like or a method of radiating a laser ray into a wafer along lines intended to be cut, thereby forming modified regions, etc. can be mentioned. About the laser processing of the wafer, methods described in Japanese Patent Application Laid-Open Nos. 2002-192370 and 2003-338467 can be used. About the machine therefor, for example, a MAHOHDICING MACHINE manufactured by Tokyo Seimitsu Co., Ltd. can be used. The laser ray into the semiconductor wafer may be radiated through the front face of the semiconductor wafer, that is, the face on which a circuit is formed, or may be radiated through the rear face of the semiconductor wafer, that is, the face on which no circuit is formed and the adhesive sheet is stuck. In the case that the step II) is performed after the step I), the step I') which will be described later, or the step III, it is preferred to use, as the adhesive sheet or the dicing tape, a sheet or a tape which transmits the laser ray since the laser ray thereby can be radiated into the semiconductor wafer from the side of the adhesive sheet or the dicing tape. It is also preferred that the adhesive sheet has a different transparency or color tone from that of the dicing tape since its portion that has been unable to be broken, that is, be cut is easily recognized.

In the present invention, for example, the above-mentioned laser processing machine is used to focus a ray on an inner portion of the silicon wafer, and the laser ray is radiated thereto from the side of the front face of the silicon wafer along its lines intended to be cut, under conditions described below. In this way, modified regions are formed inside the silicon wafer. Wafers can be cut according to the modified regions along the lines intended to be cut. The modified regions are preferably melting-treated regions formed by heating and melting the inner regions of the semiconductor wafer locally by multi-photons absorption.

(Laser Processing Conditions)
(A) Semiconductor substrate: a silicon wafer (thickness: 350 μm, and outer diameter: 6 inches)
(B) Laser source: a semiconductor laser excitation Nd:YAG laser
  Wavelength: 1064 nm
  Laser ray spot sectional area: $3.14 \times 10^{-8}$ cm$^2$
  Oscillation mode: Q switch pulse
  Recurring frequency: 100 kHz
  Pulse width: 30 ns
  Power: 20 μJ/pulse
  Laser ray quality: TEM$_{00}$
  Polarization property: linearly polarized light
(C) Condensing laser
  Magnification: 50 times
  NA: 0.55
  Transmittance to the laser ray wavelength: 60%
(D) Shifting speed of a mounting support on which the semiconductor substrate is put: 100 mm/second In the step III), the dicing tape is stuck onto the face opposite to the face of the semiconductor wafer onto which the adhesive sheet is stuck by a method known in the prior art. The temperature for the sticking, that is, the laminating temperature is preferably from 0 to 60° C., more preferably from 10 to 40° C., and even more preferably from 15 to 30° C. In the case that the step III) is performed after the step II), it is preferred to perform the lamination while supporting the wafer not to be deformed in order to prevent the wafer from being broken by stress or deformation in the laminating step.

The semiconductor producing method of the present invention may comprise, as the step I') instead of the steps I) and III), the step of sticking a dicing tape integrated type adhesive sheet of the invention onto the semiconductor wafer.

In this case, the method of producing a semiconductor device of the present invention comprises I') the step of sticking a dicing tape integrated type adhesive sheet of the invention onto a semiconductor wafer, and II) the step of rendering the semiconductor wafer permissible to be cut in order of I'-II or II-I', and further comprises: IV) the step of cutting the semiconductor wafer and the adhesive sheet of the dicing tape integrated type adhesive sheet of the invention, thereby yielding adhesive-sheet-stuck semiconductor chips which are individual pieces, and V) the step of bonding the adhesive-sheet-stuck semiconductor chips onto a semiconductor-chip-mounting support member.

Figure 6:
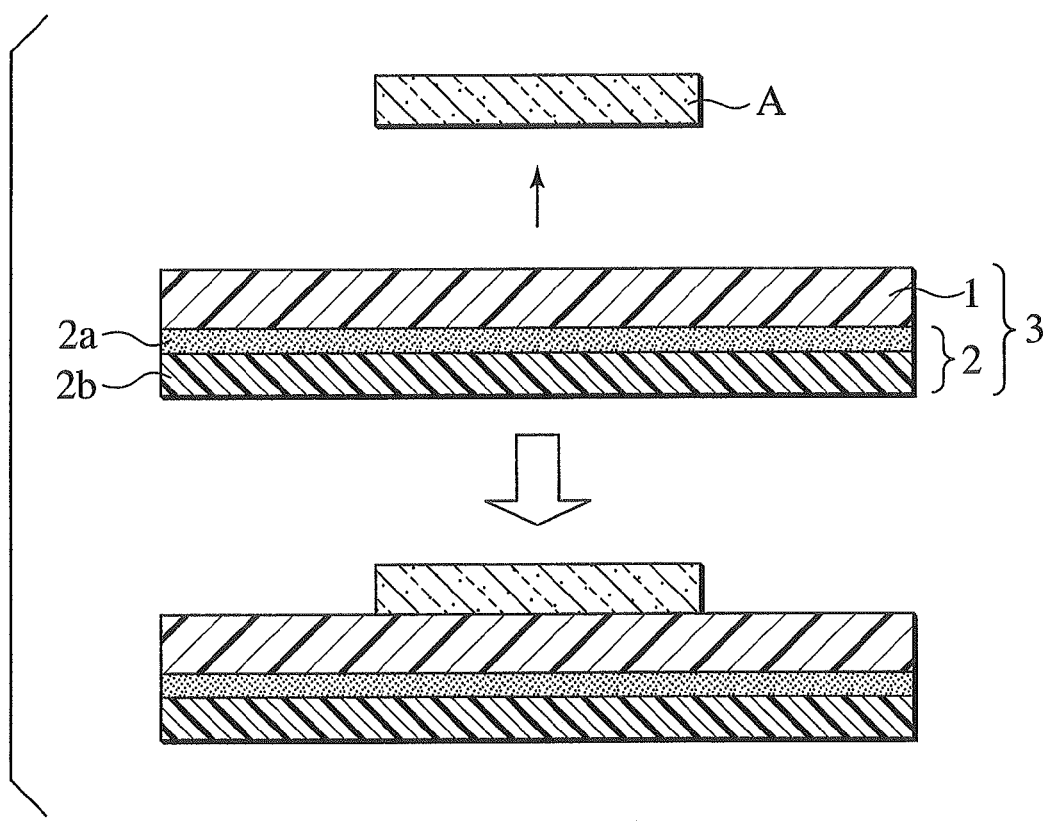
FIG. 6 is a schematic view illustrating an embodiment of the step I') in the invention.
Figure 7:
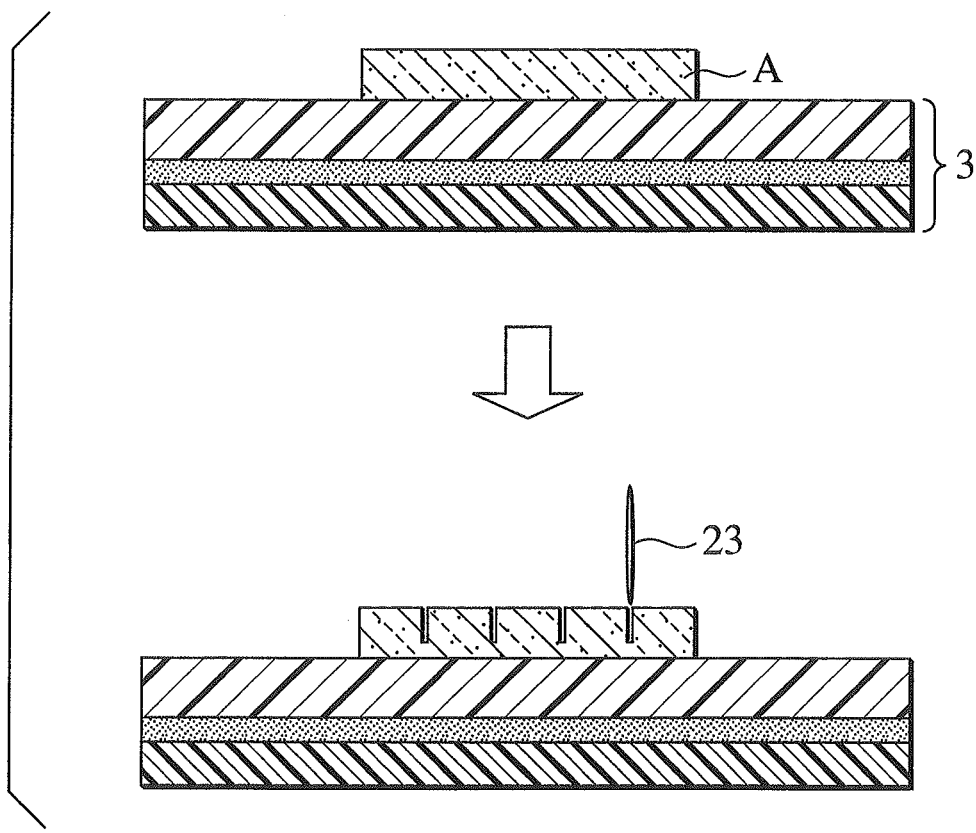
FIG. 7 is a schematic view illustrating an embodiment of the step II) in the invention.
Figure 8:
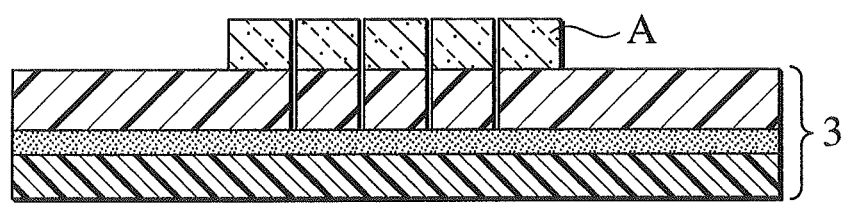
FIG. 8 is a schematic view illustrating a state that external force is applied to a wafer in FIG. 7, whereby the wafer and an adhesive sheet are cut.
Figure 9:
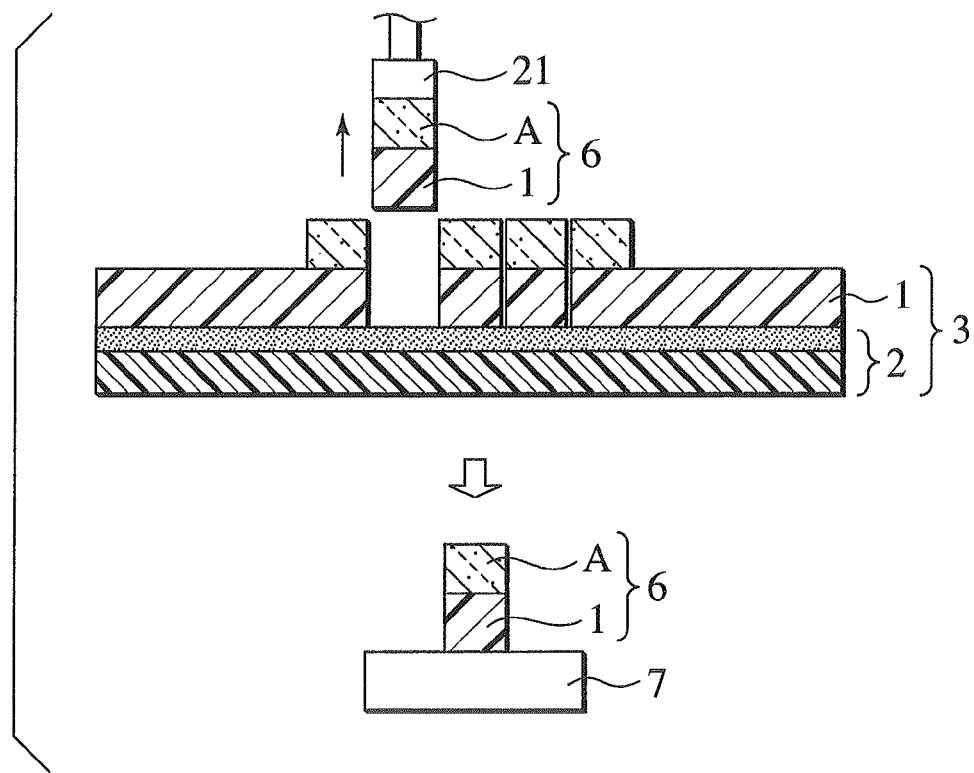
FIG. 9 is a schematic view illustrating an embodiment of the step V) in the invention.
Figure 11:
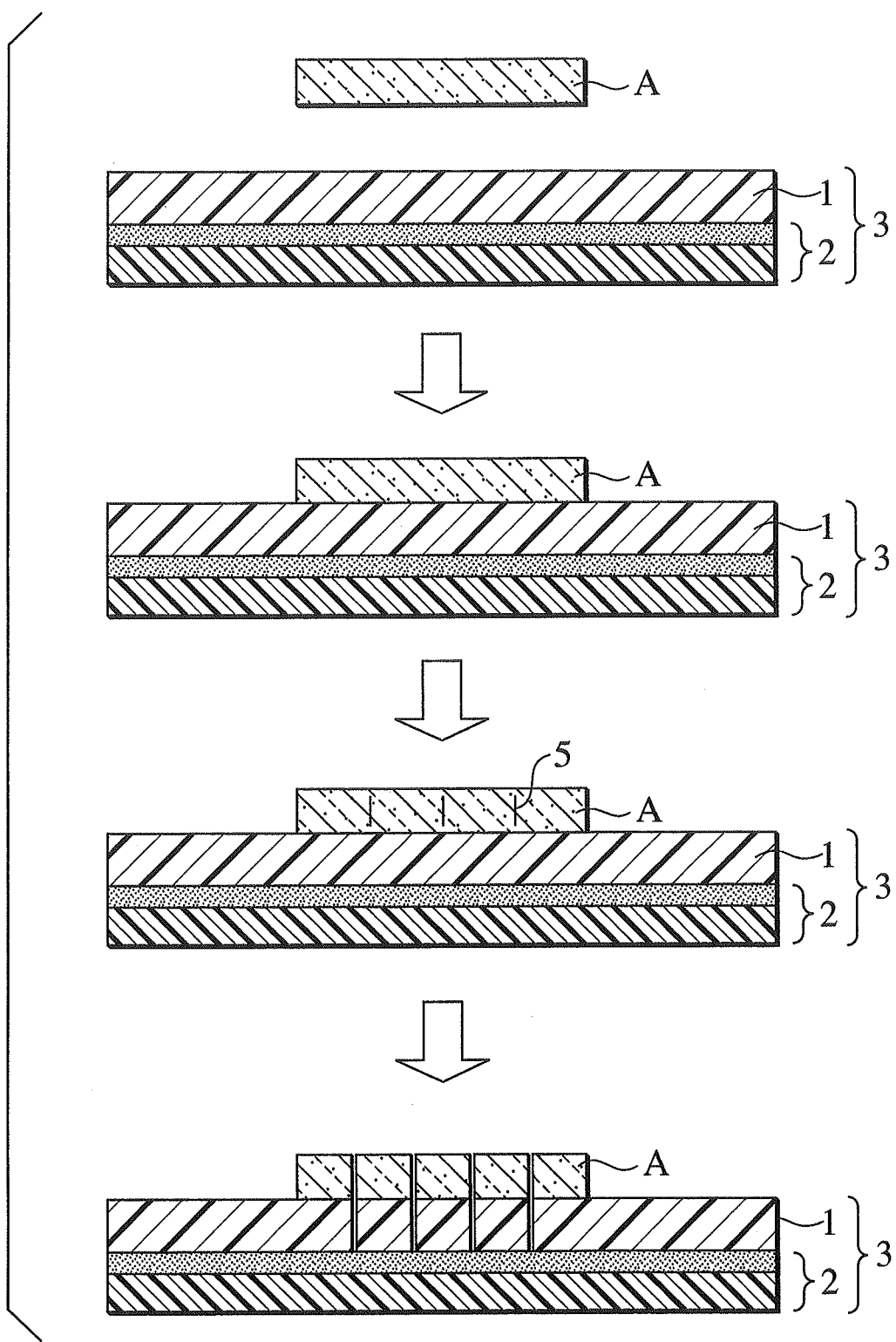
FIG. 11 is a schematic view illustrating an embodiment of the steps I'), II) and IV) in the invention.

FIG. 6 illustrates one embodiment of the step of sticking a dicing tape integrated type adhesive sheet 3 of the present invention onto a semiconductor wafer A; FIG. 7 illustrates that of the step of half-cutting the semiconductor wafer A with a dicing saw to render the wafer A permissible to be cut; FIG. 8 illustrates that of the state that external force is applied to the dicing tape integrated type adhesive sheet 3, whereby the wafer A and the adhesive sheet 1 of the dicing tape integrated type adhesive sheet 3 are cut; and FIG. 9 illustrates that of the step of bonding an adhesive-sheet-stuck semiconductor chip 6 onto a semiconductor-chip-mounting support member 7. FIG. 11 illustrates the following steps together: the step of sticking the dicing tape integrated type adhesive sheet 3 of the invention onto the semiconductor wafer A, the step of radiating a laser ray onto lines intended to be cut in the semiconductor wafer A so as to form modified regions (cutting-intended regions) 5 inside the wafer 5, thereby rendering the wafer permissible to be cut, and the step of applying external force to the dicing tape 2 or the dicing tape integrated type adhesive sheet 3, thereby cutting the semiconductor wafer A and the adhesive sheet 1. In the method of producing a semiconductor device of the invention, the combination of the method for sticking the adhesive sheet and the dicing tape onto the wafer with the dicing method is not particularly limited. From the viewpoint of workability and efficiency, a combination of the sticking of the dicing tape integrated type adhesive sheet of the invention onto the wafer with stealth dicing is most preferred.

When the dicing tape integrated type adhesive sheet is stuck onto the semiconductor wafer, they are stuck on each other so as to bring the semiconductor wafer into contact with the adhesive sheet face of the dicing tape integrated type adhesive sheet. The temperature for the sticking, that is, the laminating temperature is preferably from 0 to 170° C. In order to make a warp of the wafer small, the temperature is more preferably from 20 to 130° C., in particular preferably from 20 to 60° C.

After the steps I), II) and III), or the step I') and II), the step IV) is performed; in this step, the cutting of the semiconductor wafer and the adhesive sheet can be attained by applying external force to the dicing tape or the dicing tape integrated type adhesive sheet. For example, in the case of half cut dicing, this external force is preferably applied thereto in a bending direction or twisting direction. In the case of stealth dicing, the force is preferably applied thereto in an expanding direction.

For example, in the case of expanding both ends of the dicing tape in stealth dicing to apply external force, thereby cutting the wafer and the adhesive sheet, the cutting can be attained with a commercially available wafer expanding device. More specifically, as illustrated in FIG. 4, a ring 11 is stuck and fixed onto the periphery of the dicing tape 2 arranged on a stage 13, and next a pushing-up section 12 is raised to apply tensile force the dicing tape 2 from its both ends. The speed of raising the pushing-up section at this time is defined as the expand speed and the height 14 of the elevation of the pushing-up section is defined as the expand amount. In this case, the expand speed is preferably from 10 to 1000 mm/second, more preferably from 10 to 100 mm/second, and in particular preferably from 10 to 50 mm/second in the invention. The expand amount is preferably from 5 to 30 mm, more preferably from 10 to 30 mm, and in particular preferably from 15 to 20 mm. If the expand speed is less than 10 mm/second, the semiconductor wafer and the adhesive sheet tend not to be easily cut. If the speed is more than 1000 mm/second, the dicing tape tends to be easily broken. If the expand amount is less than 5 mm, the semiconductor wafer and the adhesive sheet tend not to be easily cut. If the amount is more than 30 mm, the dicing tape tends to be easily broken.

When the dicing tape is expanded in this way so as to apply external force, the semiconductor wafer is cracked in the thickness direction thereof from the modified regions, inside the wafer, as starting points. This crack reaches the front and rear faces of the wafer and the rear face of the adhesive sheet adhering closely to the semiconductor wafer. Thus, the semiconductor wafer and the adhesive sheet are broken, that is, are cut. In this way, adhesive-sheet-stuck semiconductor chips can be obtained.

When the expand amount is more than 25 mm, it is preferred to use a polyvinylchloride base material for the substrate layer of the dicing tape. If the amount of the expand is small, it is preferred to use various polyolefin base materials. Preferably, the expand is performed at room temperature. As the need arises, the temperature for the expand may be adjusted in the range of −50 to 100° C. In the invention, the temperature is preferably from −50 to 60° C., more preferably form 0 to 40° C. As the temperature at the time of the expand is lower, the breaking elongation of the adhesive sheet is smaller so as to be more easily be cut. Accordingly, lower temperature is more preferred in order to prevent a decline in the yield due to the cut failure of the adhesive sheet.

In the case that a UV curing adhesive agent is used in the adhesive layer of the dicing tape, ultraviolet rays are radiated to the dicing tape from the side of its face opposite to its semiconductor-wafer-stuck face before or after the expand, so as to cure the UV curing adhesive agent. In this way, the adhesive force between the UV curing adhesive agent and the adhesive sheet lowers, thereby making picking-up in the subsequent step V) easy.

Subsequently, in the step V), an adsorbing collet 21, a needle clamp 22 and so on, as illustrated in FIG. 5 or 9, are used as picking-up means to pick up a number of the adhesive-sheet-stuck semiconductor chips, which are individual pieces, and this is mounted onto a semiconductor-chip-mounting area of a semiconductor-chip-mounting support member. The adhesive sheet is then heated and cured. Usually, the heating and curing are performed at a temperature ranging from 100 to 220° C.

The semiconductor producing method of the invention is not limited to the above-mentioned processes, and may comprise any other step. For example, in any stage after the step I) or I') is performed and before the step IV) is performed, the method may comprise the step of radiating ultraviolet rays, infrared rays or microwaves into the adhesive sheet, or the step of heating or cooling the adhesive sheet. If necessary, the method comprises a wire bonding step, a sealing step or the like after the step V) is performed.

EXAMPLES

The present invention will be described in more detail by way of the following examples. However, the invention is not limited thereto.

Compositions of Adhesive Sheets, and Producing Method Thereof

Example 1

Cyclohexanone was added to a composition composed of: 30 parts by weight of a bisphenol F type epoxy resin (trade name: YD-8170C, manufactured by Tohto Kasei Co., Ltd., epoxy equivalent: 160) and 10 parts by weight of a cresol novolak type epoxy resin (trade name: YDCN-703, manufactured by Tohto Kasei Co., Ltd., epoxy equivalent: 210) as epoxy resins; 27 parts by weight of a phenol novolak resin (trade name: Priophen LF2882, manufactured by Dainippon Ink & Chemicals, Inc.) as a curing agent for the epoxy resins; 28 parts by weight of an epoxy-group-containing acrylic rubber (trade name: HTR-860P-3DR, manufactured by Nagase Chemtex Corp.; weight-average molecular weight based on gel permeation chromatography: 800000, glycidyl methacrylate: 3% by weight, and Tg: −7° C.) as an epoxy-group-containing acrylic copolymer; 0.1 part by weight of an imidazole curing accelerator (Curezol, manufactured by Shikoku Chemicals Corp.) as a curing accelerator; 95 parts by weight of a silica filler (S0-C2 (specific gravity: 2.2 g/cm$^3$), manufactured by Admafine Corp.); and 0.25 part by weight of a silane coupling agent (trade name: A-189, manufactured by Nippon Unicar Company Limited) and 0.5 part by weight of a silane coupling agent (trade name: A-1160 manufactured by Nippon Unicar Company Limited). The components were stirred, mixed and subjected to vacuum deairing to yield an adhesive agent varnish.

This adhesive agent varnish was applied onto a polyethylene terephthalate film, 50 μm in thickness, subjected to releasing treatment, and then the resultant was heated and dried at 90° C. for 10 minutes and at 120° C. for 5 minutes to give a coating film 25 μm in thickness. In this way, an adhesive sheet in a B-stage state was produced. In the same manner, an adhesive sheet, 75 μm in thickness, in a B-stage state was produced.

Examples 2 to 6

About respective compositions shown in Table 1, adhesive sheets were produced in the same way as in Example 1. The adhesive sheet of Example 6 was an adhesive sheet obtained by subjecting the sheet of Example 1 to heat treatment at 40° C. for 24 hours, thereby lowering the breaking elongation.

Comparative Examples 1 to 5

About respective compositions shown in Table 1, adhesive sheets were produced in the same way as in Example 1.

thickness of 25 μm, a tensile tester (a digital load indicator manufactured by Imada Corp.) was used to measure the stress-strain curve thereof at a distance between its chuck of 20 mm and a tensile speed of 0.5 m/minute, and then the breaking strength and breaking elongation thereof at 25° C. were obtained therefrom in accordance with the following equations:

Breaking strength(Pa)=Maximum strength(N)/Sectional area($m^2$) of the sample

Breaking elongation(%)=(Sample length(mm) between the chucks when the sample was broken−20)/20×100

TABLE 1

| Items | Unit | Example 1 | Example 2 | Example 3 | Example 4 | Example 5 | Example 6 |
|---|---|---|---|---|---|---|---|
| YD-8170C | Parts by weight | 30 | 30 | 30 | 30 | 30 | 30 |
| YDCN-703 | Parts by weight | 10 | 10 | 10 | 10 | 10 | 10 |
| LF-2882 | Parts by weight | 27 | 27 | 27 | 27 | 27 | 27 |
| 2PZ-CN | Parts by weight | 0.1 | 0.1 | 0.1 | 0.1 | 0.1 | 0.1 |
| A-189 | Parts by weight | 0.25 | 0.25 | 0.25 | 0.25 | 0.25 | 0.25 |
| A-1160 | Parts by weight | 0.5 | 0.5 | 0.5 | 0.5 | 0.5 | 0.5 |
| HTR-860P-3 | Parts by weight | 28 | 44.1 | 33.1 | 31.7 | 28.3 | 28.0 |
| S0-C2 | Parts by weight | 95 | 110 | 66.1 | 132.2 | 180.6 | 95 |
| Polymer fraction * | % | 29.2 | 39.4 | 32.8 | 31.8 | 29.4 | 29.2 |
| Filler weight fraction | % | 49.8 | 49.6 | 39.6 | 57.0 | 65.3 | 49.8 |
| Filler volume fraction | % | 34.1 | 34.0 | 25.5 | 40.9 | 49.6 | 34.1 |

| Items | Unit | Comparative Example 1 | Comparative Example 2 | Comparative Example 3 | Comparative Example 4 | Comparative Example 5 |
|---|---|---|---|---|---|---|
| YD-8170C | Parts by weight | 30 | 30 | 30 | 30 | 30 |
| YDCN-703 | Parts by weight | 10 | 10 | 10 | 10 | 10 |
| LF-2882 | Parts by weight | 27 | 27 | 27 | 27 | 27 |
| 2PZ-CN | Parts by weight | 0.1 | 0.1 | 0.1 | 0.1 | 0.1 |
| A-189 | Parts by weight | 0.25 | 0.25 | 0.25 | 0.25 | 0.25 |
| A-1160 | Parts by weight | 0.5 | 0.5 | 0.5 | 0.5 | 0.5 |
| HTR-860P-3 | Parts by weight | 180 | 28.3 | 66.1 | 44.1 | 66.1 |
| S0-C2 | Parts by weight | 0 | 0 | 253 | 47.2 | 56.7 |
| Polymer fraction * | % | 72.6 | 29.4 | 49.3 | 39.4 | 49.3 |
| Filler weight fraction | % | 0 | 0 | 65.4 | 29.7 | 29.7 |
| Filler volume fraction | % | 0 | 0 | 49.7 | 18.1 | 18.1 |

\* Polymer fraction: the weight fraction of polymer components having a Tg from −10 to 50° C. and a weight-average molecular weight from 50000 to 1000000 to all constituent components of each adhesive sheet from which any filler component was removed Among the adhesive sheets of Examples 1 to 6 and Comparative Examples 1 to 5, the adhesive sheets 75 μm in thickness were used to make evaluation about elastic modulus out of the following evaluation items, and the adhesive sheet 25 μm in thickness were used to make evaluation about other items. The resultant results are shown in Table 2.

[Adhesive Sheet Evaluating Method]

(1) Breaking Strength and Breaking Elongation

About each of the samples of the B-stage state adhesive sheets having a width of 10 mm, a length of 30 mm and a (2) Remaining Volatile Matter Content The remaining volatile matter content was obtained by measuring the weight (mass A) of each of the B-stage state films, which was cut into a 5 cm square, allowing the film to stand still on a releasable substrate in a drying machine at 170° C. for 1 hour, measuring the weight (mass B) thereof again, and then making a calculation in accordance with the following equation:

Remaining volatile matter content(%)=($A−B$)×100/$A$ (3) Elastic Modulus (Storage Elastic Modulus)

A dynamic viscoelasticity measuring device (DVE-V4, manufactured by Rheology Co.) was used to measure the storage elastic modulus of each of the B-stage state adhesive sheets (sample size: 20 mm in length×4 mm in width×74 μm in thickness, temperature range: −30 to 100° C., temperature-raising rate: 5° C./minute, and tensile mode: 10 Hz or 900 Hz under an automatic static load).

(4) Tacking Strength

A tacking tester manufactured by Rhesca Company, Limited was used to measure the tacking strength of each of the B-stage state adhesive sheets at 25° C. in accordance with a method described in JISZ0237-1991 (probe diameter: 5.1 mm, peeling speed: 10 mm/s, contact load: 100 gf/cm$^2$, and contact time: 1 second).

(5) Adhesive Force

A chip (5 mm square) and a gold plating substrate (a copper foil fitted flexible substrate electroplated with gold (Ni: 5 μm, and Au: 0.3 μm)) were laminated onto each of the adhesive sheets on a hot plate of 120° C. temperature, and then the sheet was cured at 130° C. for 30 minutes and at 170° C. for 1 hour. About this sample, the peel strength thereof was measured at 260° C. before the sample absorbed moisture and after the sample absorbed moisture at 85° C./85% RH for 48 hours.

(6) Laminate Property

Each of the adhesive sheets having a width of 10 mm and a wafer were laminated onto each other with a hot roll laminator (at 60° C., 0.3 m/minute and 0.3 MPa). Thereafter, a UTM-4-100 model tensilon manufactured by Toyobalwin was used to peel the adhesive sheet at an angle of 90° and a tensile speed of 50 mm/minute in an atmosphere of 25° C. temperature. The peel strength at this time was obtained. In the case that the adhesive sheet had a peel strength of 30 N/m or more, the laminate property was judged to be good. In the case that the adhesive sheet had a peel strength of less than 30 N/m, the laminate property was judged to be poor.

(7) Flow

By use of a thermo-compression bonding tester (manufactured by Tester Sangyo Co., Ltd.), a sample obtained by punching out each of the samples and a PET film thereon into the form of a 1×2 cm stripe was pressed at a hot plate temperature of 160° C. and a pressure of 1 MPa for 18 seconds. Thereafter, the length of the resin forced out from the edge of the sample was measured with an optical microscope. This was defined as the flow amount.

(8) Breakability by Half-Cut Dicing

An adhesive sheet and a dicing tape, which were separately produced, were arranged in such a manner that the adhesive sheet was stacked onto the dicing tape. These were laminated on each other at 25° C. with a hot roll laminator (Riston manufactured by Du Pont), thereby yielding a dicing tape integrated type adhesive sheet. At this time, the used dicing tape was a dicing tape (UC3004M-80) manufactured by the Furukawa Electric Co., Ltd. The film thickness of the dicing tape was 80 μm. Next, a semiconductor wafer to be diced was stuck onto the adhesive sheet face of the dicing tape integrated type adhesive sheet. At this time, the used semiconductor wafer was a semiconductor wafer having a thickness of 80 μm. The laminating temperature was 60° C. Subsequently, a dicing cutter was used to half-cut-dice the wafer, and then washed and dried to work the wafer into a cut-permissible state, so that at least two semiconductor chips would be yielded when external force was applied to the wafer. Thereafter, the dicing tape integrated type adhesive sheet was bent, thereby cutting the adhesive sheet and the semiconductor wafer to yield adhesive-sheet-stuck semiconductor chips. If the semiconductor wafer and the adhesive sheet were simultaneously cut by 90% or more of the distance over which they were half-cut-diced, the breakability thereof was judged to be good. If they were simultaneously cut by less than 90% thereof, the breakability was judged to be poor.

(9) Reflow Crack Resistance, and Temperature Cycle Resistance

A semiconductor element and each of the adhesive sheets, which were each cut into a 5 mm square, were laminated onto a wiring board wherein a polyimide film 25 μm in thickness was used as its substrate. In this way, semiconductor device samples (wherein solder balls were formed on their single face) were produced. The heat resistance thereof was examined. As the method for evaluating the heat resistance, the evaluations of reflow crack resistance and the temperature cycle resistance were used.

In the evaluation of the reflow crack resistance, each of the samples was passed through an IR reflow furnace, the temperature in which was set to raise to the highest temperature of the sample surface 260° C. and keep the temperature for 20 seconds. The sample was then allowed to stand still at room temperature, so as to be cooled. This treatment was repeated 2 times. In this sample, cracks were examined with the naked eye and an ultrasonic microscope. The case that in none of the samples, the number of which was ten, a crack was generated was judged to be good (○). The case that in one or more of the samples, a crack was generated was judged to be poor (x).

About the temperature cycle resistance, the samples were allowed to stand still in an atmosphere of −55° C. temperature for 30 minutes, and then allowed to stand still in an atmosphere of 125° C. temperature for 30 minutes. This step, which was one cycle, was repeated 1000 times. After the 1000 cycles, the sample was observed with an ultrasonic microscope. The case that in none of the samples, the number of which was ten, a break such as a crack or peeling was generated was judged to be good (○). The case that in one or more of the samples, a break was generated was judged to be poor (x).

TABLE 2

| Items | | Unit | Conditions | Example 1 | Example 2 | Example 3 | Example 4 | Example 5 | Example 6 |
|---|---|---|---|---|---|---|---|---|---|
| Breaking strength | | MPa | 25° C. | 5.8 | 4.6 | 4.4 | 5.5 | 7.4 | 5.7 |
| Breaking elongation | | % | 25° C. | 28 | 35 | 40 | 20 | 15 | 20 |
| Flow | | μm | 160° C. | 660 | 328 | 790 | 380 | 50 | 450 |
| Remaining volatile matter content | | % | — | 0.4 | 0.3 | 0.4 | 0.4 | 0.3 | 0.4 |
| Adhesive force | Before the absorption of moisture | Kg | 260° C. | 1.1 | 1.2 | 1.1 | 1.1 | 0.4 | 1.1 |
| | After the absorption of moisture | Kg | 260° C. | 0.8 | 0.7 | 0.7 | 0.7 | 0.3 | 0.8 |

TABLE 2-continued

| | | | | | | | |
|---|---|---|---|---|---|---|---|
| Elastic modulus | MPa | 25° C. 10 Hz | 1000 | 1900 | 720 | 1800 | — | 1300 |
| | | 60° C. 10 Hz | 4.2 | 13 | 2.5 | 20 | 35 | 6.4 |
| | | 25° C. 900 Hz | 5400 | 7000 | 5800 | 6200 | — | 6600 |
| | | −20° C. 10 Hz | 7800 | 8000 | 6700 | 7800 | — | 7900 |
| Tacking strength Air face | gf | 25° C. | 5 | 5 | 8 | 3 | 3 | 4 |
| | | 40° C. | 12 | 27 | 40 | 27 | 12 | 10 |
| | | 60° C. | 41 | 62 | 85 | 55 | 23 | 32 |
| | | 80° C. | 90 | 161 | 198 | 111 | 34 | 78 |
| Tacking strength Substrate film face | gf | 25° C. | 8 | 7 | 9 | 4 | 4 | 6 |
| | | 40° C. | 15 | 31 | 45 | 27 | 14 | 13 |
| | | 60° C. | 97 | 290 | 240 | 120 | 27 | 88 |
| | | 80° C. | 162 | 300 | 300 | 173 | 49 | 142 |
| Laminate property | — | 60° C. | Good | Good | Good | Good | Poor | Good |
| Breakability | — | 25° C. | Broken | Broken | Broken | Broken | Broken | — |
| Reflow crack resistance | — | — | ○ | ○ | ○ | ○ | ○ | ○ |
| Temperature cycle resistance | — | — | ○ | ○ | ○ | ○ | ○ | ○ |

| Items | Unit | Conditions | Comparative Example 1 | Comparative Example 2 | Comparative Example 3 | Comparative Example 4 | Comparative Example 5 |
|---|---|---|---|---|---|---|---|
| Breaking strength | MPa | 25° C. | 19.4 | 1.4 | 7.2 | 2.3 | 2.2 |
| Breaking elongation | % | 25° C. | 330 | 425 | 145 | 103 | 100 |
| Flow | μm | 160° C. | 523 | >1000 | 50 | 346 | 222 |
| Remaining volatile matter content | % | — | 0.4 | 0.4 | 0.4 | 0.3 | 0.4 |
| Adhesive force | Before the absorption of moisture | Kg | 260° C. | 1.6 | 1.4 | 0.3 | 1 | 1.3 |
| | After the absorption of moisture | Kg | 260° C. | 1.5 | 1 | 0.3 | 0.7 | 1 |
| Elastic modulus | MPa | 25° C. 10 Hz | 300 | — | — | 1200 | 1300 |
| | | 60° C. 10 Hz | 5 | 5 | 30 | 7 | 12 |
| | | 25° C. 900 HZ | 3000 | — | — | 3800 | 3600 |
| | | −20° C. 10 Hz | 3200 | — | — | 3900 | 3800 |
| Tacking strength Air face | gf | 25° C. | 6 | 18 | 3 | 11 | 7 |
| | | 40° C. | 18 | 37 | 11 | 63 | 38 |
| | | 60° C. | 40 | 67 | 23 | 96 | 58 |
| | | 80° C. | 64 | 200 | 40 | 176 | 89 |
| Tacking strength Substrate film face | gf | 25° C. | 11 | 19 | 4 | 9 | 9 |
| | | 40° C. | 36 | 55 | 10 | 155 | 61 |
| | | 60° C. | 67 | 102 | 34 | 290 | 302 |
| | | 80° C. | 171 | 300 | 40 | 300 | 340 |
| Laminate property | — | 60° C. | Good | Good | Poor | Good | Good |
| Breakability | — | 25° C. | Not broken | Not broken | Not broken | Not broken | Not broken |
| Reflow crack resistance | — | — | ○ | ○ | ○ | ○ | ○ |
| Temperature cycle resistance | — | — | ○ | ○ | X | ○ | ○ |

About Examples 1 to 4, their elastic moduli, breaking strengths and the breaking elongations are within the ranges specified in the invention, and their laminate property and breakability are good. Their handleability is excellent since their tacking strengths are small at room temperature, and further their reflow crack resistance and temperature cycle resistance are also excellent since their adhesive forces at high temperature are excellent. About Example 5, its breakability is good but the laminate property at 60° C. is poor so that Example 5 is unsuitable for low-temperature lamination. About Comparative Examples 1 to 5, their elastic moduli, breaking strengths and breaking elongations are out of the ranges specified in the invention. Thus, all of them are poor in breakability.

[Production of Adhesive-Sheet-Stuck Semiconductor Chip by Stealth Dicing]

Each of the adhesive sheets of Examples 1 to 3, Example 6 and Comparative Examples 1 and 5 was combined with appropriate one out of the following steps 1 to 4, thereby producing an adhesive-sheet-stuck semiconductor chip. The breakability and the forcing-out of the resin from its edge were evaluated. Each of the steps is roughly shown in Table 3. Table 4 shows a combination of each of the adhesive sheets with a step therefor, and evaluation results of the breakability and the forcing-out from the edge.

(Step 1)

An adhesive sheet was laminated at 60° C. onto a semiconductor wafer (thickness: 80 μm) to be diced with a hot roll laminator (Riston, manufactured by Du Pont). A laser ray was radiated into the resultant adhesive-sheet-stuck semiconductor wafer A, as illustrated in FIG. 2, thereby forming modified regions inside the wafer. Next, a dicing tape ((UC3004M-80) manufactured by the Furukawa Electric Co., Ltd.) was stacked on the other face of the adhesive sheet. A ring made of stainless steel was fitted to the periphery of the dicing tape. Subsequently, the ring was fixed thereto and the dicing tape was expanded with an expanding device. As for conditions for this expand, the expand speed was 30 mm/, and the expand amount was 15 mm.

(Step 2)

A laser ray was radiated into a semiconductor wafer (thickness: 80 μm), as illustrated in FIG. 2, to form modified regions inside the wafer. Next, an adhesive sheet was laminated onto the semiconductor wafer A at 60° C. with a hot roll laminator (Riston, manufactured by Du Pont). Next, a dicing tape ((UC3004M-80) manufactured by the Furukawa Electric Co., Ltd.) was stacked on the other face of the adhesive sheet. A ring made of stainless steel was fitted to the periphery of the dicing tape. Subsequently, the ring was fixed thereto and the dicing tape was expanded with an expanding device. As for conditions for this expand, the expand speed was 30 mm/s, and the expand amount was 15 mm.

(Step 3)

A laser ray was radiated into a semiconductor wafer (thickness: 80 μm), as illustrated in FIG. 2, to form modified regions inside the wafer. Next, a dicing tape integrated type sheet, wherein an adhesive sheet and a dicing tape ((UC3004M-80) manufactured by the Furukawa Electric Co., Ltd.) were laminated onto each other, was laminated onto the wafer at 60° C. with a hot roll laminator (Riston manufactured by Du Pont). A ring made of stainless steel was fitted to the periphery of the dicing tape. Subsequently, the ring was fixed thereto and the dicing tape was expanded with an expanding device. As for conditions for this expand, the expand speed was 30 mm/s, and the expand amount was 15 mm.

(Step 4)

A laser ray was radiated into a semiconductor wafer (thickness: 80 μm), as illustrated in FIG. 2, to form modified regions inside the wafer. Next, an adhesive sheet was laminated onto the wafer at 60° C. with a hot roll laminator (Riston manufactured by Du Pont). Thereafter, the adhesive sheet was heated at 120° C. for 10 minutes. Next, a dicing tape (UC3004M-80) manufactured by the Furukawa Electric Co., Ltd.) was stacked on the other face of the adhesive sheet. A ring made of stainless steel was fitted to the periphery of the dicing tape. Subsequently, the ring was fixed thereto and the dicing tape was expanded with an expanding device. As for conditions for this expand, the expand speed was 30 mm/s, and the expand amount was 15 mm.

TABLE 3

| Step 1 | Step 2 | Step 3 | Step 4 |
|---|---|---|---|
| Preparation of a wafer | Preparation of a wafer | Preparation of a wafer | Preparation of a wafer |
| ↓ | ↓ | ↓ | ↓ |
| Sticking of an adhesive sheet | Laser processing | Laser processing | Laser processing |
| ↓ | ↓ | ↓ | ↓ |
| Laser processing | Sticking of an adhesive sheet | Sticking of an adhesive sheet integrated type dicing tape | Sticking of an adhesive sheet |
| ↓ | ↓ | ↓ | ↓ |
| Sticking of a dicing tape | Sticking of a dicing tape | Expand | Heating of the adhesive sheet |
| ↓ | ↓ | | ↓ |
| Expand | Expand | | Sticking of a dicing tape |
| | | | ↓ |
| | | | Expand |

(Breakability)

After the expand, it was observed with an optical microscope whether or not each of the semiconductor wafers and the adhesive sheet thereon were broken. The case that the product was broken by 98% or more of the distance over which the dicing was performed was judged to be very good (⊚); the case that the product was broken by 90% or more thereof was judged to be good (○); the case that the product was broken by 50% or more and less than 90% thereof was judged to be partially good (Δ); and the case that the product was broken by less than 50% thereof was judged to be poor (X).

(Forcing-Out from the Edge)

Figure 10:
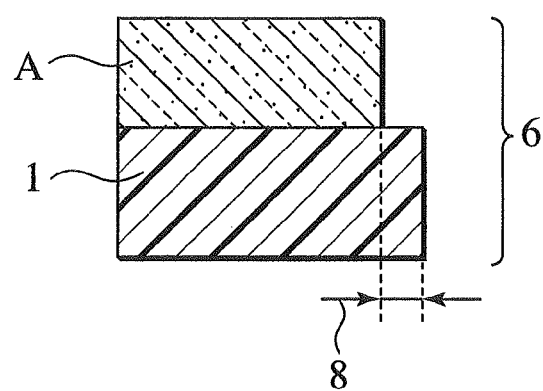
FIG. 10 is a schematic view illustrating an embodiment of an adhesive-sheet-stuck semiconductor chip.

About each of the picked-up adhesive-sheet-stuck semiconductor chips, the edges of the semiconductor chip and the adhesive sheet were observed as illustrated in FIG. 10. The length 8 of the adhesive sheet forced out from the edge of the chip without being broken was defined as the forced-out length. The case that the length was zero or more and less than 20 μm was judged to be very good (⊚); the case that the length was from 20 to 100 μm was judged to be good (○); and the case that the length was more than 100 μm was judged to be poor (X).

TABLE 4

| Items | | Example 7 | Example 8 | Example 9 | Example 10 | Example 11 | Example 12 | Example 13 | Example 14 |
|---|---|---|---|---|---|---|---|---|---|
| Adhesive sheet | | Example 1 | Example 1 | Example 1 | Example 1 | Example 2 | Example 2 | Example 2 | Example 2 |
| Step | | Step 1 | Step 2 | Step 3 | Step 4 | Step 1 | Step 2 | Step 3 | Step 4 |
| Breakability | | ⊚ | ○ | ○ | ⊚ | ○ | Δ | Δ | ⊚ |
| Forcing-out from the edge | | ⊚ | ○ | ○ | ⊚ | ○ | ○ | ○ | ⊚ |
| Breaking strength (Mpa) | | 5.8 | 5.8 | 5.8 | 8 | 4.6 | 4.6 | 4.6 | 7.8 |
| Breaking elongation (%) | | 28 | 28 | 28 | 6.1 | 35 | 35 | 35 | 9.5 |
| Elastic modulus (MPa) | 25° C. 10 Hz | 1000 | 1000 | 1000 | 1400 | 1900 | 1900 | 1900 | 2200 |
| | 60° C. 10 Hz | 4.2 | 4.2 | 4.2 | 15 | 13 | 13 | 13 | 20 |
| | 25° C. 900 Hz | 5400 | 5400 | 5400 | 6500 | 7000 | 7000 | 7000 | 7500 |
| | −20° C. 10 Hz | 7800 | 7800 | 7800 | 7850 | 8000 | 8000 | 8000 | 8100 |

| Items | | Example 15 | Example 16 | Example 17 | Example 18 | Example 19 | Example 20 | Example 21 | Example 22 |
|---|---|---|---|---|---|---|---|---|---|
| Adhesive sheet | | Example 3 | Example 3 | Example 3 | Example 3 | Example 6 | Example 6 | Example 6 | Example 6 |
| Step | | Step 1 | Step 2 | Step 3 | Step 4 | Step 1 | Step 2 | Step 3 | Step 4 |
| Breakability | | ○ | Δ | Δ | ⊚ | ⊚ | ⊚ | ⊚ | ⊚ |
| Forcing-out from the edge | | ○ | ○ | ○ | ⊚ | ⊚ | ⊚ | ⊚ | ⊚ |
| Breaking strength (Mpa) | | 4.4 | 4.4 | 4.4 | 7.8 | 5.7 | 5.7 | 5.7 | 8 |
| Breaking elongation (%) | | 40 | 40 | 40 | 12 | 20 | 20 | 20 | 6.4 |
| Elastic modulus (MPa) | 25° C. 10 Hz | 720 | 720 | 720 | 1200 | 1300 | 1300 | 1300 | 1600 |
| | 60° C. 10 Hz | 2.5 | 2.5 | 2.5 | 12 | 6.4 | 6.4 | 6.4 | 15 |
| | 25° C. 900 Hz | 5800 | 5800 | 5800 | 6800 | 6600 | 6600 | 6600 | 7500 |
| | −20° C. 10 Hz | 6700 | 6700 | 6700 | 7500 | 7900 | 7900 | 7900 | 8200 |

TABLE 4-continued

| Items | | Comparative Example 6 | Comparative Example 7 | Comparative Example 8 | Comparative Example 9 |
|---|---|---|---|---|---|
| Adhesive sheet | | Comparative Example 1 | Comparative Example 5 | Comparative Example 1 | Comparative Example 5 |
| Step | | Step 1 | Step 2 | Step 3 | Step 4 |
| Breakability | | X | X | X | X |
| Forcing-out from the edge | | X | X | X | X |
| Breaking strength (Mpa) | | 19.4 | 2.2 | 19.4 | 2.2 |
| Breaking elongation (%) | | 330 | 100 | 330 | 100 |
| Elastic | 25° C. 10 Hz | 300 | 1300 | 300 | 1300 |
| modulus | 60° C. 10 Hz | 5 | 12 | 5 | 12 |
| (MPa) | 25° C. 900 Hz | 3000 | 3600 | 3000 | 3600 |
| | −20° C. 10 Hz | 3200 | 1800 | 3200 | 1800 |

About Examples 7 to 22, their elastic moduli, breaking strengths and the breaking elongations are within the ranges specified in the present invention, and their laminate property and breakability are good. Their handleability is excellent since their tacking strengths are small at room temperature, and further their reflow crack resistance and temperature cycle resistance are also excellent since their adhesive forces at high temperature are excellent. In particular, in Examples 10, 14, 18 and 22, the breakability thereof is improved since the adhesive sheets therein were post-heated. Examples 19 to 22, wherein the breaking elongations of the adhesive sheets were decreased, have excellent breakability.

About the Comparative Examples, their elastic moduli, breaking strengths and breaking elongations are out of the ranges specified in the present invention. Thus, all of them are poor in breakability.

According to the present invention, it is possible to provide an adhesive sheet which can be stuck onto a wafer at a low temperature of 100° C. or lower, is as flexible as the sheet can be handled at room temperature, and can be cut at the same time as the wafer is cut under ordinary cutting conditions.

According to the adhesive sheet of the present invention, it is also possible to apply the following methods simultaneously to a dicing step in the production of a semiconductor device: a wafer-cutting method such as half cut dicing or stealth dicing; and a method of using an adhesive sheet in a wafer-back-face sticking mode. For this reason, the dicing step can be effectively attained.

Even when a very thin wafer having a thickness of 100 μm or less is used, the use of the adhesive sheet of the invention makes it unnecessary to cut the wafer and the adhesive sheet simultaneously with a dicing saw or the like; therefore, the speed of the dicing can be made large. For this reason, according to the adhesive sheet of the invention, the processing speed of semiconductor devices and the yield thereof can be improved.

When the adhesive sheet of the invention is used, cut faces of the adhesive sheet and a chip thereon can be made consistent with each other within the range of a difference of 100 μm or less. Even if the cutting is not attained, it can easily be checked whether the adhesive sheet is separated or not; therefore, picking-up failure is not caused and a semiconductor device can be effectively produced.

Moreover, bonding reliability is excellent in the step of jointing a semiconductor element with a semiconductor-element-mounting support member in the production of a semiconductor device, as well. In other words, when a semiconductor element is mounted onto a support member, the adhesive sheet of the invention has necessary heat resistance and humidity resistance and exhibits satisfactory workability.

Those skilled in the art will understand that the above are concerned with preferred embodiments of the present invention and a great number of changes and modifications can be carried out without disobeying the spirit and scope of the invention.

The invention claimed is:

1. A method of producing a semiconductor device, comprising:
   I') a step of sticking a dicing tape integrated adhesive sheet onto a semiconductor wafer, wherein the dicing tape integrated adhesive sheet is formed by lamination of an adhesive sheet and a dicing tape; and the adhesive sheet comprises a polymer component, an epoxy resin and a filler, wherein the breaking strength of the adhesive sheet in a B-stage state is from 0.1 to 10 Mpa at 25° C.; and the breaking elongation of the adhesive sheet is from 1 to 40% at 25° C.; and the dicing tape comprises a substrate layer made of a polyvinyl chloride; and
   II) a step of rendering the semiconductor wafer permissible to be cut by a method of half cut dicing or stealth dicing, with steps I' and II being carried out in order of I'-II or II-I'; and further comprising:
   III) a step of cutting the semiconductor wafer and the adhesive sheet of the dicing tape integrated adhesive sheet by applying external force of the expand amount being more than 25 mm and 30 mm or less wherein the expand amount is measured as the height of the elevation of the dicing tape being pushed up at both of its ends, thereby yielding adhesive-sheet-stuck semiconductor chips which are individual pieces; and
   IV) a step of bonding the adhesive-sheet-stuck semiconductor chips onto a semiconductor-chip-mounting support member.

2. The method of producing a semiconductor device according to claim 1, wherein the polymer component has a glass transition temperature of −30 to 50° C. and has a weight-average molecular weight of 50,000 to 1,000,000.

3. The method of producing a semiconductor device according to claim 2, wherein the polymer component is contained in an amount of 50% or less of the total weight of the adhesive sheet from which the weight of the filler is removed.

4. The method of producing a semiconductor device according to claim 1, wherein the content of remaining volatile matters in the adhesive sheet after production thereof is from 0.01 to 3% by weight.

5. The method of producing a semiconductor device according to claim 1, wherein the adhesive sheet has a film thickness of 1 to 250 μm.

6. The method of producing a semiconductor device according to claim 1, wherein the polymer component comprises an acrylic rubber.

7. The method of producing a semiconductor device according to claim 1, wherein the elastic modulus of the adhesive sheet in a B-stage state is from 1 to 3,000 MPa in measurement of the dynamic viscoelasticity at 25° C. and 10 Hz; and the elastic modulus of the adhesive sheet is from 4,000 to 20,000 MPa in measurement of the dynamic viscoelasticity at 25° C. and 900 Hz.

8. The method of producing a semiconductor device according to claim 1, wherein the elastic modulus of the adhesive sheet in a B-stage state is from 1 to 3,000 MPa in measurement of the dynamic viscoelasticity at 25° C. and 10 Hz; and the elastic modulus of the adhesive sheet is from 4,000 to 20,000 MPa in measurement of the dynamic viscoelasticity at −20° C. and 10 Hz.

9. The method of producing a semiconductor device according to claim 7, wherein the elastic modulus of the adhesive sheet in a B-stage state is from 0.1 to 20 MPa in measurement of the dynamic viscoelasticity at 60° C. and 10 Hz.

10. The method of producing a semiconductor device according to claim 8, wherein the elastic modulus of the adhesive sheet in a B-stage state is from 0.1 to 20 MPa in measurement of the dynamic viscoelasticity at 60° C. and 10 Hz.

11. The method of producing a semiconductor device according to claim 1, wherein an amount of the filler is 35 to 50% by weight of the total weight of the adhesive sheet.

12. The method of producing a semiconductor device according to claim 1, wherein the filler has a specific gravity of 1 to 10 g/cm$^3$.

13. The method of producing a semiconductor device according to claim 1, wherein in step III the semiconductor wafer and the adhesive sheet of the dicing tape are simultaneously cut.

* * * * *